(12) United States Patent
Dvir et al.

(10) Patent No.: US 7,062,619 B2
(45) Date of Patent: Jun. 13, 2006

(54) MASS STORAGE DEVICE ARCHITECTURE AND OPERATION

(75) Inventors: Ran Dvir, Beit Yehoshua (IL); Zeev Cohen, Safed (IL); Eduardo Maayan, Kfar Sava (IL)

(73) Assignee: Saifun Semiconductor Ltd., Netanya (IL)

( * ) Notice: Subject to any disclaimer, the term of this patent is extended or adjusted under 35 U.S.C. 154(b) by 537 days.

(21) Appl. No.: 10/211,235

(22) Filed: Aug. 5, 2002

(65) Prior Publication Data

US 2003/0145176 A1    Jul. 31, 2003

Related U.S. Application Data

(60) Provisional application No. 60/352,588, filed on Jan. 31, 2002.

(51) Int. Cl.
*G06F 12/00* (2006.01)
(52) U.S. Cl. ....................... 711/154; 711/103
(58) Field of Classification Search .............. None
See application file for complete search history.

(56) References Cited

U.S. PATENT DOCUMENTS

| | | | | |
|---|---|---|---|---|
| 5,579,502 A | * | 11/1996 | Konishi et al. | 711/103 |
| 5,835,927 A | * | 11/1998 | Fandrich et al. | 711/2 |
| 6,374,337 B1 | * | 4/2002 | Estakhri | 711/169 |
| 6,418,506 B1 | * | 7/2002 | Pashley et al. | 711/103 |
| 6,633,956 B1 | | 10/2003 | Mitani | |
| 6,744,692 B1 | * | 6/2004 | Shiota et al. | 365/230.03 |
| 2003/0145176 A1 | | 7/2003 | Dvir et al. | |
| 2003/0145188 A1 | | 7/2003 | Cohen et al. | |

* cited by examiner

*Primary Examiner*—Mano Padmanabhan
*Assistant Examiner*—Paul Baker
(74) *Attorney, Agent, or Firm*—Eitan Law Group

(57) ABSTRACT

A mass storage device comprising at least one array of memory cells, at least one data path unit in communication with the at least one array, the at least one data path unit comprising a master buffer, and a main data bus adapted to transfer data between the at least one data path unit and an input/output (I/O) unit via a buffer interface unit (BIF) comprising a plurality of slave buffers, the main data bus being further adapted to support at least one of a download and upload of data between the main data bus and the I/O unit, during simultaneous performance of an internal operation between the main data bus and the at least one array, the internal operation comprising at least one of a read, program and erase operation. Methods for operating the mass storage device are also disclosed.

28 Claims, 18 Drawing Sheets

MASS STORAGE DEVICE ARCHITECTURE AND OPERATION

CROSS-REFERENCE TO RELATED APPLICATIONS

The present application claims priority from U.S. provisional application Ser. No. 60/352,588, filed Jan. 31, 2002, which is hereby incorporated by reference in its entirety.

FIELD OF THE INVENTION

The present invention relates generally to mass storage devices, and particularly to architectures for mass storage devices that include non-volatile memory cell arrays and cache memory.

BACKGROUND OF THE INVENTION

Mass storage non-volatile memory (NVM) devices enable read and/or write access to data containing many bytes. Mass storage devices are typically, but not only, used in applications such as hard disks, or digital video storage devices, such as for digital cameras. Throughout the specification and claims, the term "mass storage device" refers not only to memory devices that are capable of the storage functionality of hard disks or video storage devices and the like, but also to memory devices capable of storing and providing access to at least 512 megabyte (MB) of data or to memory devices requiring very fast programming and read access rates. The amount of data accessible with the mass storage device may include "blocks" of data. A "block" is defined as a basic amount of data containing a certain amount of bytes, e.g., 256 bytes (256B), 512B, 528B or any other number of bytes.

Chip architectures in mass storage devices must support fast data transfer rates. Prior art mass storage devices typically include one or more buffer memory devices (buffer memory). The buffer memory is used to receive and temporarily store data at the high data transfer rate supported by the particular communication link being used. After the data is received, it may then be read from the buffer memory and processed.

In order to efficiently transfer data from a sending device to a receiving device, such as between a mass storage device (e.g., operating as a hard disk) and a buffer memory, burst data transfers may be used. A burst data transfer is a series of data transfers that occurs without an interrupt between one device and another device. A receiving device that is able to receive burst transfers may typically include both a buffer memory and some sort of data management system for managing the burst transfers. The data management system may be used to perform a number of functions. For example, the data management system may determine whether to enable the next transfer of a burst from a sending device. This determination is largely based on whether there is enough space available in the buffer memory of the receiving device to receive the burst without corrupting previously stored data. The data management system may also be used to coordinate the re-transmission and rewriting of a burst into the buffer memory if an originally transmitted burst was determined invalid.

Prior art data management systems for accomplishing these functions may include a microprocessor and a software routine, or alternatively a relatively complex state machine. However, this may have the disadvantage of significant system overhead, thereby reducing the performance level of a receiving device, or alternatively, requiring high cost control circuitry to achieve the desired performance level.

Cache memory may be typically used to bridge the gap between fast processor cycle times and slow memory access times. A cache is a small amount of very fast, expensive, preferably zero wait state memory that is used to store a copy of frequently accessed code and data from system memory. The microprocessor can operate out of this very fast memory and thereby reduce the number of wait states that must be interposed during memory accesses. Static random access memories (SRAMs) are typically used as cache memories.

System RAM speed may be controlled by bus width and bus speed. Bus width refers to the number of bits that may be sent to the processor simultaneously, and bus speed refers to the number of times a group of bits may be sent each second. A bus cycle occurs every time data travels from memory to the processor. Bit latency refers to the number of clock cycles needed to read a bit of information. For example, RAM rated at 100 MHz is capable of sending a bit in $1 \times 10^{-8}$ seconds, but may take $5 \times 10^{-8}$ seconds to start the read process for the first bit.

To compensate for latency, processors typically use a technique called burst mode. Burst mode depends on the expectation that data requested by the processor will be stored in sequential memory cells. The memory controller anticipates that whatever the processor is working on will continue to come from this same series of memory addresses, so it reads several consecutive bits of data together. This means that only the first bit is subject to the full effect of latency; reading successive bits takes significantly less time.

Accordingly, it is desirable to provide a chip architecture in mass storage devices for reducing first bit latency and yet maintaining fast read throughput.

Writing data into an NVM mass storage device usually comprises programming bits in the NVM array according to the input data. Programming NVM bits typically comprises application of one or more programming pulses followed by a verification phase, in which the bits are read to determine their programming state. Typically, multiple program pulse—program verify cycles may be required to complete programming all the bits.

In mass storage devices a fast write rate is usually required. A fast programming rate may be achieved in one or more ways, such as but not limited to, programming a large number of bits in parallel, reducing the number of program pulse—program verify cycles, shortening each phase in these cycles, and shortening the overhead times within the programming procedure. The data to be programmed to the NVM array is usually loaded upfront to the device and temporarily stored in a volatile data buffer (e.g., an SRAM array). After applying a programming pulse, the data read out from the NVM array is usually stored in a second volatile buffer, and program verification is carried out by comparing the data of the two buffers (the original data to be programmed and the temporarily read out data). Such a method requires two separate buffers and increases the die size.

It is therefore desired to provide a chip architecture in mass storage devices that both supports overhead time reduction within program—program verify cycles and enables program verify operations without a need for a second buffer.

SUMMARY OF THE INVENTION

The present invention seeks to provide an improved chip architecture of a mass storage device, which may, amongst other things, significantly reduce first bit latency and yet maintain fast read throughput, support overhead time reduction within program—program verify cycles, and enable program verify operations without a need for an additional second buffer.

There is thus provided in accordance with an embodiment of the present invention a mass storage device comprising at least one array of memory cells, at least one data path unit in communication with the at least one array, the at least one data path unit comprising a master buffer, and a main data bus adapted to transfer data between the at least one data path unit and an input/output (I/O) unit via a buffer interface unit (BIF) comprising a plurality of slave buffers, the main data bus being further adapted to support at least one of a download and upload of data between the main data bus and the I/O unit, during simultaneous performance of an internal operation between the main data bus and the at least one array, the internal operation comprising at least one of a read, program and erase operation.

In accordance with an embodiment of the present invention a volatile memory device is in communication with the main data bus comprising a data buffer and a redundancy buffer.

Further in accordance with an embodiment of the present invention the volatile memory device comprises a static random access memory device (SRAM).

Still further in accordance with an embodiment of the present invention the data buffer and the redundancy buffer have the same size. Alternatively, the data buffer and the redundancy buffer may have different sizes.

In accordance with an embodiment of the present invention the data buffer and the redundancy buffer are interleaved, utilizing mutual peripheral circuits.

Further in accordance with an embodiment of the present invention the at least one array comprises a redundant portion dedicated to store data that is supposed to be stored in other portions of the at least one array, and the redundancy unit is adapted to re-route data which is intended for one portion of the at least one array to the redundant portion.

Still further in accordance with an embodiment of the present invention the redundancy unit re-routes the data based on volatile data stored in a redundancy buffer.

In accordance with an embodiment of the present invention the volatile data stored in the redundancy buffer is loaded from a non-volatile memory when the device is powered up.

Further in accordance with an embodiment of the present invention the redundancy unit re-routes the data once prior to accessing a block of data.

Still further in accordance with an embodiment of the present invention the master buffer has the same size as an internal word of the at least one array.

Additionally in accordance with an embodiment of the present invention the slave buffers have the same size as an internal word of the at least one array.

There is also provided in accordance with an embodiment of the present invention a method for operation of a mass storage device, the method comprising providing at least one array of memory cells, at least one data path unit in communication with the at least one array, the at least one data path unit comprising a master buffer, and a main data bus adapted to transfer data between the at least one data path unit and an input/output (I/O) unit via a buffer interface unit (BIF) comprising a plurality of slave buffers, and performing at least one of a download and upload of data between the main data bus and the I/O unit, while in parallel performing an internal operation between the main data bus and the at least one array, the internal operation comprising at least one of a read, program and erase operation.

In accordance with an embodiment of the present invention performing the internal operation comprises inserting data from the I/O unit to a first of the slave buffers, and inserting data from the I/O unit to a second of the slave buffers, while uploading data from the first slave buffer to a data buffer of a volatile memory device.

In accordance with an embodiment of the present invention performing the internal operation further comprises performing a read access to the at least one array while still inserting data from the I/O unit to one of the slave buffers.

In accordance with an embodiment of the present invention performing the internal operation further comprises re-reading data from directly from the volatile memory device without re-reading the data from the at least one array.

In accordance with an embodiment of the present invention performing the internal operation further comprises performing a Boolean operation on binary integers 0 and 1 that designate a programmed state of a bit in the at least one array (referred to as "ARRAY") and whether the volatile memory device includes programming instructions for the bit (referred to as "SRAM"), wherein binary integer 0 indicates that the bit is required to be programmed, and binary integer 1 indicates that the bit is not required to be programmed.

Further in accordance with an embodiment of the present invention the Boolean operation may be performed within a single clock cycle.

In accordance with an embodiment of the present invention performing the internal operation comprises verifying which bits in the at least one array need to be programmed by performing a "complex mode" function comprising the Boolean operation ("SRAM") OR (NOT "ARRAY").

Further in accordance with an embodiment of the present invention performing the internal operation comprises determining which bits in the at least one array need to be re-programmed, in an operation to recover original data to be programmed in the at least one array, by performing an "n-complex mode" function comprising the Boolean operation ("SRAM") AND ("ARRAY").

In accordance with an embodiment of the present invention performing the internal operation further comprises programming data in the at least one array by means of a first in, first out (FIFO) method comprising a first level of data transfer to and from the master buffer, a second level of data transfer to and from the first slave buffer, and a third level of data transfer to and from the second slave buffer.

Further in accordance with an embodiment of the present invention the programming comprises transferring a first portion of data from the volatile memory device to the first slave buffer, transferring a second portion of data from the volatile memory device to the second slave buffer, transferring the first portion of data stored in the first slave to the master buffer while the second portion of data is still stored in the second slave buffer, and applying a program pulse to bits in the at least one array in accordance with the first portion of data.

Still further in accordance with an embodiment of the present invention the programming comprises transferring another first portion of data from the volatile memory device to the first slave buffer, and transferring the second portion of data stored in the second slave to the master buffer.

In accordance with an embodiment of the present invention performing the internal operation comprises performing an enhanced read operation comprising transferring a first portion of data from the at least one array to the first slave buffer, transferring a second portion of data from the at least one array to the second slave buffer, transferring the first portion of data from the first slave buffer to the I/O unit, and extracting data from the I/O unit.

Further in accordance with an embodiment of the present invention extracting data from the I/O unit initiates an additional read access to the at least one array, wherein data is transferred from the at least one array to the at least one of the main buffer, the first slave buffer and the second slave buffer.

In accordance with an embodiment of the present invention the method further comprises transferring the second portion of data from the second slave buffer to the I/O unit, and extracting data from the I/O unit.

Further in accordance with an embodiment of the present invention extracting data from the I/O unit initiates an additional read access to the at least one array, wherein data is transferred from the at least one array to the at least one of the main buffer, the first slave buffer and the second slave buffer.

In accordance with an embodiment of the present invention the method further comprises repeatedly extracting data from the I/O unit so as to repeatedly output data from the slave buffers one at a time, repeatedly trigger a new read access from the at least one array, and repeatedly reload the slave buffer that is empty with data from the master buffer until the data to be read is fully read out.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
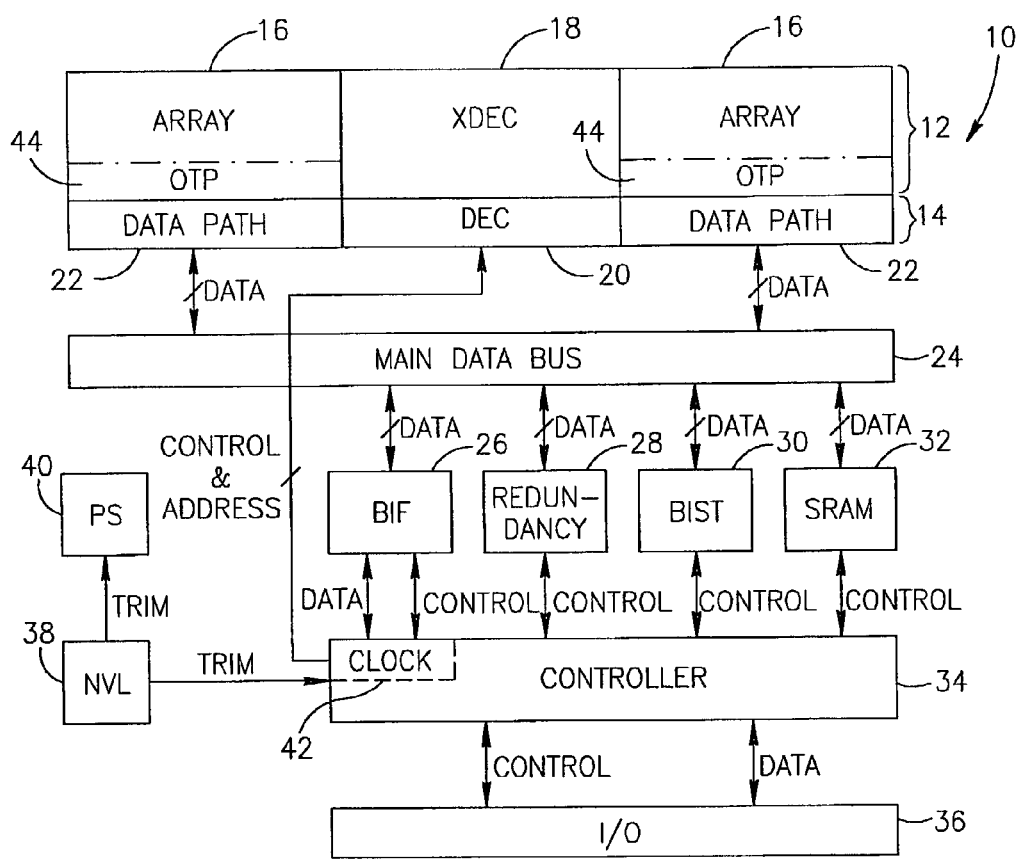
FIG. 1 is a simplified block diagram illustration of a mass storage device, constructed and operative in accordance with a preferred embodiment of the present invention.

Reference is now made to FIG. 1, which illustrates a mass storage device 10, constructed and operative in accordance with a preferred embodiment of the present invention.

In accordance with an embodiment of the invention, the mass storage device 10 may comprise a NVM core 12 and periphery 14. The core 12 may comprise one or more banks of memory cell arrays 16, such as but not limited to, having a size of 0.5 Gb (for exemplary purposes only). In the illustrated embodiment there are two such arrays 16, both served by an X-decoder (XDEC) 18, however, the invention is not limited to this amount of arrays. Memory cell arrays 16 may comprise nitride, read-only memory (NROM) cells, and the array architecture may comprise a mass storage NROM array architecture as described in U.S. Patent Application No. 60/352,589, assigned to the present assignee, the disclosure of which is incorporated herein by reference. The XDEC 18 may be located between the arrays 16 to conserve space. The XDEC 18 may select and drive 16K word lines and select transistors in the arrays 16, for example.

The periphery 14 may comprise a decoding control unit (DEC) 20 and one or more data path units 22. The DEC 20 may control data coding/decoding operations related to the transfer of information to and from the NVM cells in arrays 16, such as but not limited to, selecting blocks or physical sectors, transfer of voltages and currents, and control of some operations of the data path units 22, such as enabling different signal paths to and from the NVM array. It is noted that throughout the description and claims, the data may be digital or analog, depending on the mode of operation of the mass storage device 10.

Each data path unit 22 may comprise a YMUX (y-multiplexer) to select one or more bit lines of the array 16. The data path unit 22 may further comprise driving units that drive the bit-lines in different operational modes (e.g., read, program or erase), sensing circuitry to generate a logical signal out of the array signals, a redundancy multiplexer to support column redundancy, as well as other components.

The mass storage device 10 may further comprise a main data bus 24, which may transfer data between data path units 22 and a plurality of units, such as but not limited to, a buffer interface unit (BIF) 26, a redundancy unit 28, a built-in self-test unit (BIST) 30 and static random access memory device (SRAM) 32. These units are described further hereinbelow. Main data bus 24 may handle digital or analog data in both directions to and from the data path units 22.

The BIF 26 may transfer data from a controller 34 to the main data bus 24. There is no need for the controller 34 to operate with the same width of words as the main data bus 24. For example, the controller 34 may operate with words of 8 bits, whereas the arrays 16 may operate with words of 64 bits (the invention not being limited to these values). When uploading data from the controller 34 to the arrays 16 via the main data bus 24, the BIF 26 may convert the 8-bit data from the controller 34 to 64-bit data for the arrays 16. Conversely, when downloading data from arrays 16 to the controller 34 via the main data bus 24, the BIF 26 may convert the 64-bit data from the arrays 16 to 8-bit data for the controller 34, wherein the controller 34 may download the data in groups (e.g., bytes) of 8-bits, group after group (e.g., in eight 8-bit words). The BIF 26 may comprise various components (not shown in FIG. 1) for the grouping and un-grouping of the data, such as but not limited to, slave buffers (e.g., two 64-bit buffers), flip-flops, and memory devices (e.g., two 64-bit memories). The BIF 26 may help achieve short first bit latency and fast read throughput, as is described further hereinbelow.

A user may input data and communicate with controller 34 via an I/O unit 36. A non-volatile latch (NVL) unit 38 may supply trimmed voltages to controller 34 and a power supply 40.

Figure 2:
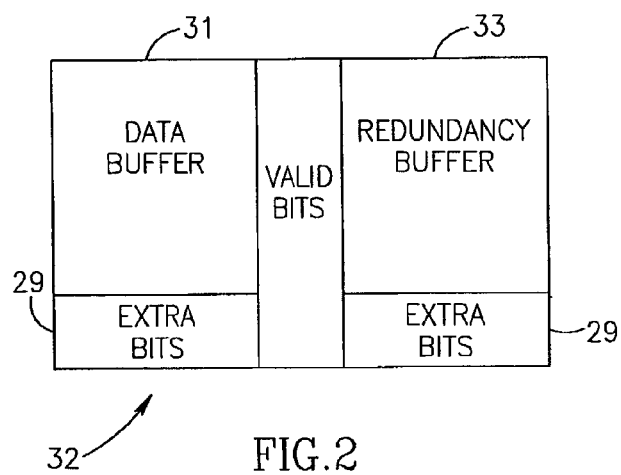
FIG. 2 is a simplified block diagram illustration of a structure of a static random access memory device (SRAM) used in the mass storage device of FIG. 1, constructed and operative in accordance with a preferred embodiment of the present invention.

Reference is now made to FIG. 2, which illustrates a generalized block diagram of a structure of SRAM 32, in accordance with an embodiment of the present invention.

SRAM 32 may include a plurality of addresses for storing therein data, which addresses may be accessed by the controller 34 through data latches (not shown) for performing operations, e.g., writing and reading, on arrays 16. SRAM 32 may comprise two portions, which may or may not be of equal size. A first portion 31 may be used as a very fast data buffer for storing data therein for performing the operations on arrays 16. The first portion of SRAM 32 may have the size of a full block, a partial block, or more than one block. For purposes of example only, the invention not being limited to these values, the first portion of SRAM 32 may comprise one block of data (e.g., 4224 bits (528 bytes)), wherein the arrays 16 comprise a plurality of such blocks. An example of fast access to the array 16 via the first portion of SRAM 32, such as in enhanced read mode, is described further hereinbelow.

In general, programming operations performed on arrays 16 may comprise writing data, which has been stored in the first portion of SRAM 32, to bits in array 16. Read and erase operations may also be performed using data stored in the first portion of SRAM 32. SRAM 32 may include information that controls the particular operation (e.g., program, erase, or read), such as, but not limited to, application of voltages to word lines and bit lines, or timing instructions that control application of these voltages.

A user may choose to program bits of the arrays 16 by application of the necessary word line and bit line voltages. However, it may be advantageous before applying these voltages to verify if the bits have already reached a programmed state. If a bit is already programmed, then application of the programming voltages is a waste of time and power, and may detrimentally affect the reliability of the memory cells. Accordingly, prior to programming, the state of a particular bit may be pre-verified to detect whether the bit is in a programmed state or not. SRAM 32 may comprise functionality that enables rapidly carrying out such pre-verification as is now described.

SRAM 32 may comprise a function referred to as "complex mode" or simply "complex". The complex mode is a type of Boolean operation performed on binary integers 0 and 1 that designate the programmed state of the bit and whether the SRAM 32 includes programming instructions for that bit. Specifically, when reading data from the array 16, the states of bits in array 16 are input in complex mode to the data portion of SRAM 32. Each bit in the data portion of SRAM 32 may correspond to a bit in the array. Binary integer 0 indicates that the bit is programmed, whereas binary integer 1 indicates that the bit is not programmed. Similarly, for each address in SRAM 32 that comprises data for writing to the array 16, binary integer 0 in the SRAM indicates that the bit should be programmed, whereas binary integer 1 indicates that the bit does not need to be programmed.

Accordingly, if an address in SRAM 32 corresponding to a particular bit in the array is 0, that means the bit in the array 16 should be programmed. If the bit is indeed programmed, then the data read out from the corresponding bit in the array 16 should input a binary 0 into the complex mode. With an input of 0 from both the SRAM 32 and the array 16, the complex mode changes the bit in the SRAM 32 to 1, which instructs the controller 34 not to further program the corresponding bit in the array 16, thus avoiding the problems of extra power, extra time and over-programming.

On the other hand, if the bit in the array 16 was not programmed, then the data from that bit for the purposes of complex mode is binary 1. With an input of 0 from the SRAM 32 and 1 from the array 16, the complex mode keeps the bit in the SRAM 32 as 0, which instructs the controller 34 to program the corresponding bit in the array 16, which is the desired result.

Conversely, if the address in SRAM 32 corresponding to the bit in the array is 1, that means the bit in the array 16 does not need programming. If the bit is indeed programmed, then the data from that bit input into the complex mode is binary 0. With an input of 1 from the SRAM 32 and 0 from the array 16, the complex mode keeps the bit in the SRAM 32 as 1, which instructs the controller 34 not to program the bit in the array 16, once again avoiding the problems of extra power, extra time and over-programming. Similarly, if the bit in the array 16 was not programmed, then the data from that bit for the purposes of complex mode is binary 1. With an input of 1 from both the SRAM 32 and the array 16, the complex mode keeps the bit in the SRAM 32 as 1, which instructs the controller 34 not to program the corresponding bit in the array 16, which is the desired result.

The complex operation may thus be employed to program verify the NVM array bits without a need for a second data buffer.

Truth Table A summarizes the complex mode.

| Complex Operation Truth Table A | | | |
| --- | --- | --- | --- |
| Existing Data in SRAM | Array Read out data | Complex Result written into the SRAM | Action |
| 0 | 0 | 1 | Do not further program the bit in the array |
| 0 | 1 | 0 | Further program the bit in the array |
| 1 | 0 | 1 | Do not further program the bit in the array |
| 1 | 1 | 1 | Do not further program the bit in the array |

It may be seen that the complex mode corresponds to the following Boolean operation: (SRAM) OR (NOT Array).

The complex mode operation may be performed within a single clock cycle or within multiple clock cycles. Performing the whole complex operation within a single clock cycle is advantageous since it significantly shortens the overall length of the program verify cycles.

Once all the bits of SRAM 32 are 1, it is a sign that all bits of the arrays 16 which should be programmed are programmed, and no further programming is required.

After or while writing data to the arrays 16, the operation may fail to reach completion, for whatever reason. As a result, the data SRAM may contain 0's, but not necessarily as in the original data (some of the 1's in the data SRAM may correspond to bits that completed their programming prior the operation failure). Then, another function of the SRAM 32 may be used to recover data that may have been lost and be able to re-write the data to another memory section in the arrays 16. This function is referred to as "n-complex mode" or simply "n-complex", as is described hereinbelow. Using the n-complex mode to recover the original data to be programmed avoids having to re-enter the data to be programmed. This is a significant savings in the system overhead, since re-entering the data would place a burden on the input data bus. Another advantage of the n-complex mode is that there may be no need for a special buffer to store data for recovery operations, which may disadvantageously use valuable space on the memory device 10. Rather the data that is already stored in the SRAM 32 may be used to recover the lost data in the array 16. Thus, if a user writes data to the array 16 and receives a failure message, the n-complex mode may be used to recover the data quickly and efficiently.

The n-complex mode is another type of Boolean operation performed on the binary integers 0 and 1 corresponding to the programmed state of the bit and the SRAM 32 programming instructions for that bit. If the bit from the array is 0, then it should be programmed if recovery action were to be taken. Accordingly, if the bit in the corresponding address in SRAM 32 is 1, the n-complex mode changes that bit in SRAM 32 to 0, meaning the bit in the array 16 (in the new location) should be programmed. In other words, in a recovery action, this will instruct the controller 34 to program the corresponding bit in the array 16, as is required. If the bit in the corresponding address in SRAM 32 is 0, the n-complex mode keeps that bit in SRAM 32 as 0, again meaning the bit in the array 16 should be programmed, as is required.

On the other hand, if the bit in the array 16 is not programmed, then the data read out from that bit for the purposes of n-complex mode is binary 1. If the corresponding address in the SRAM 32 is 0, it is a sign that the bit in the array should have been programmed but failed for some reason. The n-complex mode then keeps the bit in the SRAM 32 as 0, which, in a recovery action, instructs the controller 34 to program the corresponding bit in the array 16, as is required. Conversely, if the bit in the SRAM 32 corresponding to the bit in the array is 1, that means the bit in the array 16 does not need programming. With an input of 1 from both the SRAM 32 and the array 16, the n-complex mode keeps the bit in the SRAM 32 as 1, which instructs the controller 34 not to program the corresponding bit in the array 16, which is the desired result.

Truth Table B summarizes the n-complex mode.

N-Complex Operation Truth Table B

| Existing Data in SRAM | Array Read out data | Complex Result written to the SRAM | Action |
| --- | --- | --- | --- |
| 0 | 0 | 0 | Further program the bit in the array |
| 0 | 1 | 0 | Further program the bit in the array |
| 1 | 0 | 0 | Further program the bit in the array |
| 1 | 1 | 1 | No further programming of the bit in the array |

It may be seen that the n-complex mode is a Boolean AND operation: (SRAM) AND (Array).

The n-complex mode operation may also be performed either within a single clock cycle or within multiple clock cycles.

A second portion 33 of SRAM 32 may be of the same size (or different size) as the first portion 31, and may be used to store data therein to be used in redundancy operations in conjunction with redundancy unit 28 (with reference to FIG. 1 again), in order to replace defective portions of arrays 16.

The data portion 31 and the redundancy portion 33 of SRAM 32 may be separated. Alternatively, the data portion 31 and the redundancy portion 33 may be interleaved, meaning mutual peripheral circuits and/or components (e.g., the SRAM sense amplifiers) may be used while operating each of the portions 31 and 33. Data portion 31 and redundancy portion 33 may comprise an area 29 for extra bits.

The data path emits 22 may comprise functionality for identifying areas of the arrays 16 which have defects, and may communicate this information to redundancy unit 28. Accordingly, redundancy unit 28 may store information that indicates if certain portions of arrays 16 are suitable for writing data thereto, and if not suitable, which redundant portions of the arrays 16 are available or assigned as alternative areas for reading or writing the data thereto.

In one embodiment of the invention, redundant portions of each array 16 may be dedicated to store data that is supposed to be stored in other portions of the array 16. As a non-limiting example, and assuming a sliced array architecture as described in U.S. Patent Application No. 60/352,589, a certain number of slices of the array 16 (e.g., 4 slices), separated by isolation zones, may be dedicated for replacing defective slices according to the redundant data that has been stored in the second portion of SRAM 32. When data is to be written to the arrays 16, or if data is to be read from the arrays 16, for example, the controller 34 may normally route the operation instructions to redundancy unit 28. Redundancy unit 28 may check if the intended addressed portion of the particular array 16 is indeed suitable for performing an operation (e.g. writing data thereto). If it is suitable, then the operation may proceed via the main data bus 24 and data path 22 to the array 16. However, if the intended addressed portion of the array 16 is not suitable for whatever reason (e.g., the system detects that a column or row of the arrays 16 has defects), then that data, which normally would have been addressed to the defected columns or rows, may be re-routed by redundancy unit 28 to the redundant slices of array 16, thereby enabling uninterrupted operation of the mass storage device 10. The re-routing may comprise, without limitation, reconfiguration of the data path unit 22 so that the data is sent to the redundant slices instead of the original addresses, which have now been detected as being defective and have been marked for non-use. The re-routing to the redundant areas of the array 16 may be used to repair global as well as local defects in bit lines or physical sectors, for example. The redundancy feature may be used to repair an entire physical sector or a portion thereof, such as but not limited to, an erase sector which comprises a number of blocks smaller than the physical sector.

Reference is made again to FIG. 1. BIST 30 may comprise various self-test modalities and functionalities, such as but not limited to, the ability to place predefined vectors on the main data bus 24. For example, a user may normally enter data of 8-bits at a time. Entering a large amount of 64-bit long words in one cycle on the main data bus 24 may take a long time. BIST 30 may place predefined 64-bit long words or other data on the main data bus 24 in a fraction of the time it would normally take to enter such data. (It is again emphasized here that the invention is not limited to these values.) BIST 30 may also speed up test cycling of programming and erasing the arrays 16 with predefined vectors.

In accordance with an embodiment of the present invention, the mass storage device 10 comprises an enhanced read mode, which will be described further hereinbelow with reference to FIG. 3 and the figures that follow. The enhanced read mode may employ Time Domain Array Access (TDAA), which provides fast internal read cycling on a predefined number of parallel bits (e.g., 200 nsec), and fast internal program cycling on a predefined number of parallel bits (e.g., 250 nsec). For example, the read and programming cycles may comprise 64 bits, although the invention is not limited to this value.

However, typical read rates in mass storage systems are byte/word (8/16 bits) per 50 nsec. This may pose a problem to keep up with the external reading rate while reading directly from the internal main arrays 16. In accordance with an embodiment of the present invention, the architecture of the mass storage device 10 may solve this problem by using master-slave buffers in a pipeline fashion (wherein instruction execution overlaps) as is now described with reference to FIG. 3. This architecture may significantly reduce the first bit latency (perhaps by more than 80%) and achieve less than 5 μsec latency while maintaining a fast serial read rate. (The invention is not limited to these values.)

Figure 3:
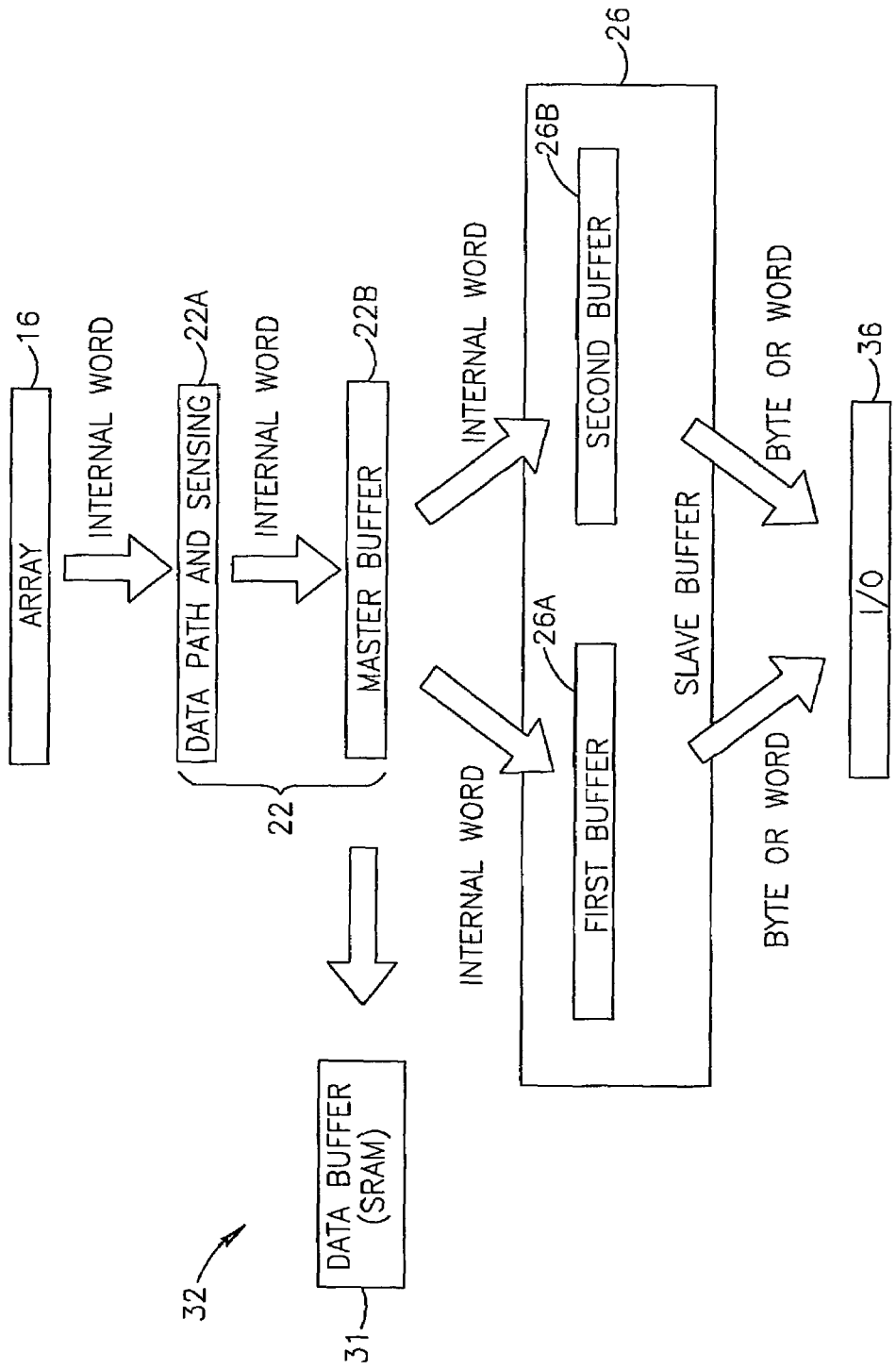
FIG. 3 is a simplified block diagram illustration of an operational flow of an enhanced read mode of the mass storage device of FIG. 1, in accordance with a preferred embodiment of the present invention.

Reference is now made to FIG. 3, which illustrates a generalized block diagram of an operation flow of an enhanced read mode of the memory device 10, in accordance with an embodiment of the present invention. Data path unit 22 may be considered as comprising two main portions: a data path and sensing portion 22A and a master buffer 22B. Master buffer 22B communicates, via main data bus 24 (not shown for the sake of simplicity in FIG. 3), with first portion 31 (the data buffer) of SRAM 32 and with BIF 26. BIF 26 serves as a slave buffer that comprises a first slave buffer 26A and a second slave buffer 26B. Data flow between array 16, data path 22 and BIF 26 may comprise 64-bit words, and data flow between BIF 26 and I/O unit 36, via controller 34, may comprise 8-bit or 16-bit words, although the invention is not limited to these values.

In summary, master buffer 22B may be sized like the internal word, may receive data directly from the main array 16, and may store the data or to pass it to any of the slave buffers 26A or 26B. The slave buffers may be sized like the internal word as well.

Figure 4:
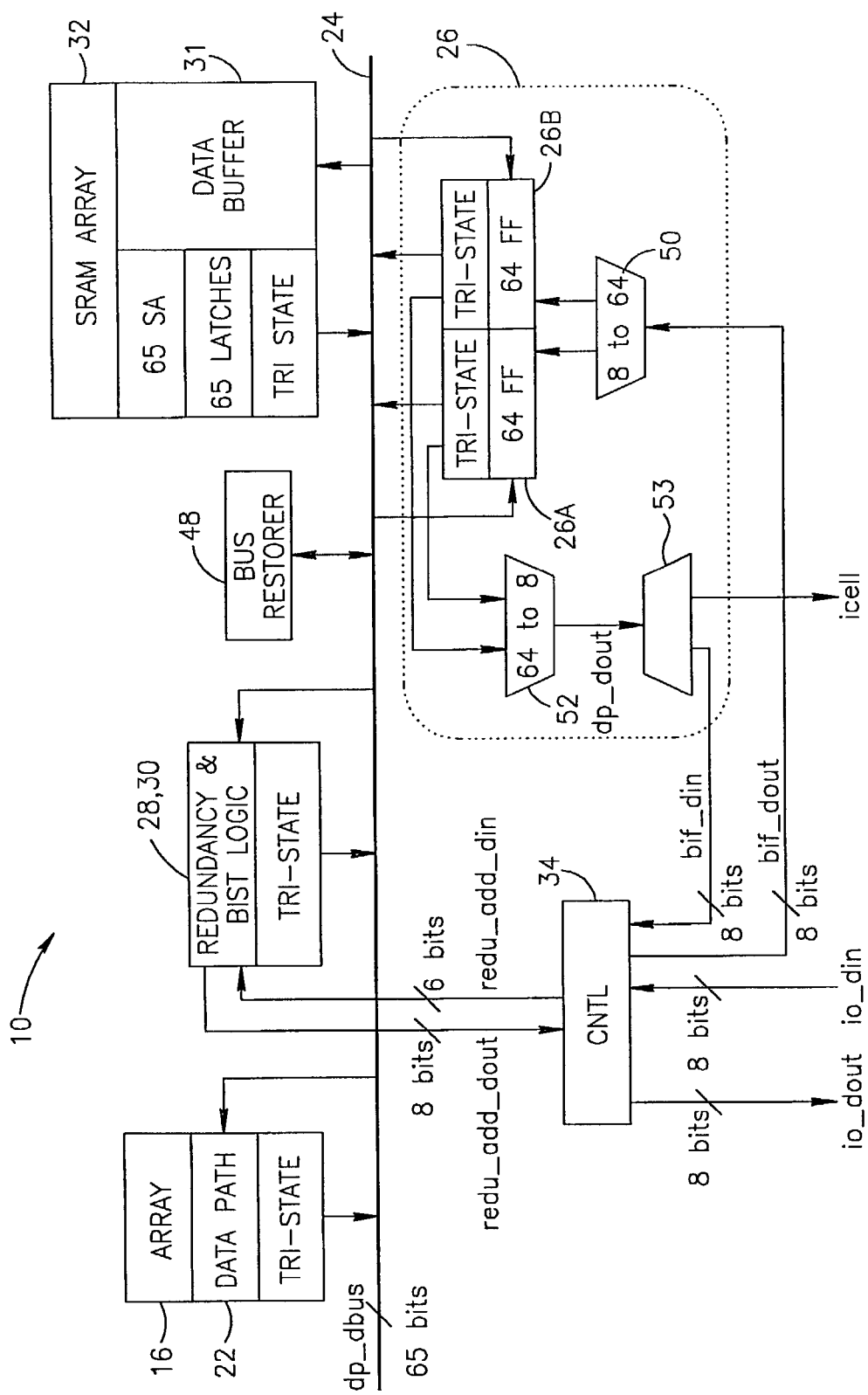
FIG. 4 is a simplified illustration of a data switch used in the mass storage device of FIG. 1, in accordance with a preferred embodiment of the present invention.

Reference is now made to FIG. 4, which illustrates data switching with the memory device 10, in accordance with an embodiment of the present invention. Main data bus 24 may comprise a tri-state bus for all the units connected thereto, and a bus restorer 48.

Controller 34 may communicate redundancy data, such as, but not limited to, 6-bit data from the controller 34 to redundancy unit 28 and BIST 30 ("redu_add_dout") and 8-bit data from the redundancy unit 28 and BIST 30 to controller 34 ("add_redu_din"). It is understood that the invention is not limited to any of the values given in the preceding or following examples. Controller 34 may receive 8-bit data from the I/O unit 36 ("io_din") and send 8-bit data to I/O unit 36 ("io_dout") (I/O unit 36 is not shown in FIG. 4 for the sake of simplicity). Controller 34 may receive 8-bit data from the BIF 26 ("bif_din") and send 8-bit data to BIF 26 ("bif_dout").

The first slave buffer 26A and second slave buffer 26B of BIF 26 may comprise 64 flip flops each. A converter 50 may convert 8-bit words received from controller 34 to 64-bit words, which are input to the first and second slave buffers 26A and 26B. Similarly, a converter 52 may convert 64-bit words, received from the first and second slave buffers 26A and 26B, to 8-bit words, which may be input via an inverter 53 to controller 34.

Reference is now made to FIGS. 5A–5D, which illustrate an example of block insertion, in an enhanced mode operation, with the memory device 10, in accordance with an embodiment of the present invention. The enhanced mode may be activated by a command or it may be the standard operation mode. When the mass storage device 10 recognizes the start of the enhanced operation, the device 10 may go into a BUSY state.

Figure 5A:
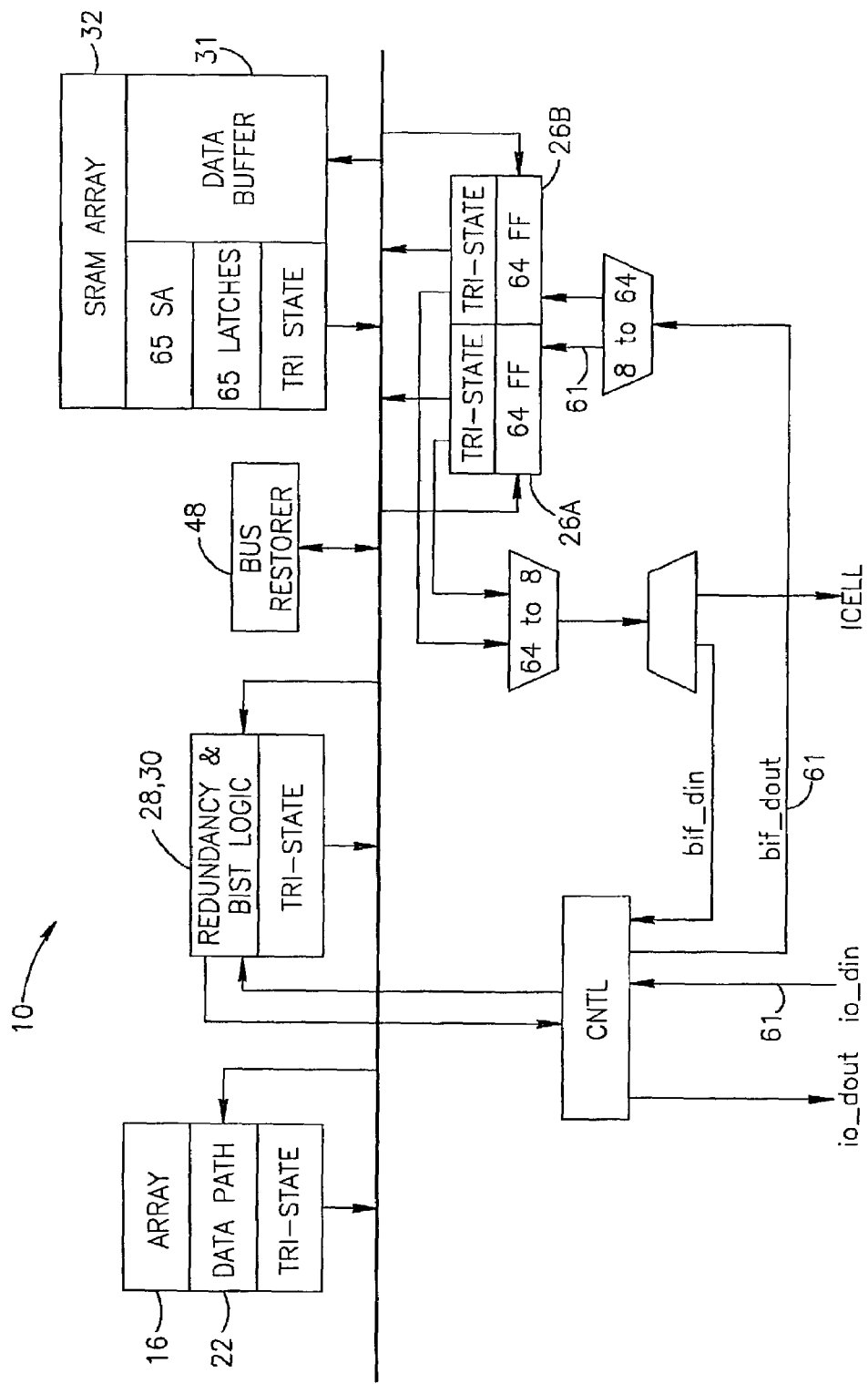
FIGS. 5A–5D are simplified illustrations of an example of block insertion, in an enhanced mode operation, with the memory device of FIG. 1, in accordance with an embodiment of the present invention.

In FIG. 5A, controller 34 may receive a first internal word of the block to be inserted (word "io_din") from I/O 36, the flow of data being indicated by arrows 61. Controller 34 may then send data "bif_dout", corresponding to the first internal word, to first slave buffer 26A, as indicated by data flow arrows 61. This loading phase may continue until the buffer 26A is full (in the example in FIG. 5A, it takes 8 cycles to load 8 bytes coming from controller 34 into the 64-bit buffer 26A).

Figure 5B:
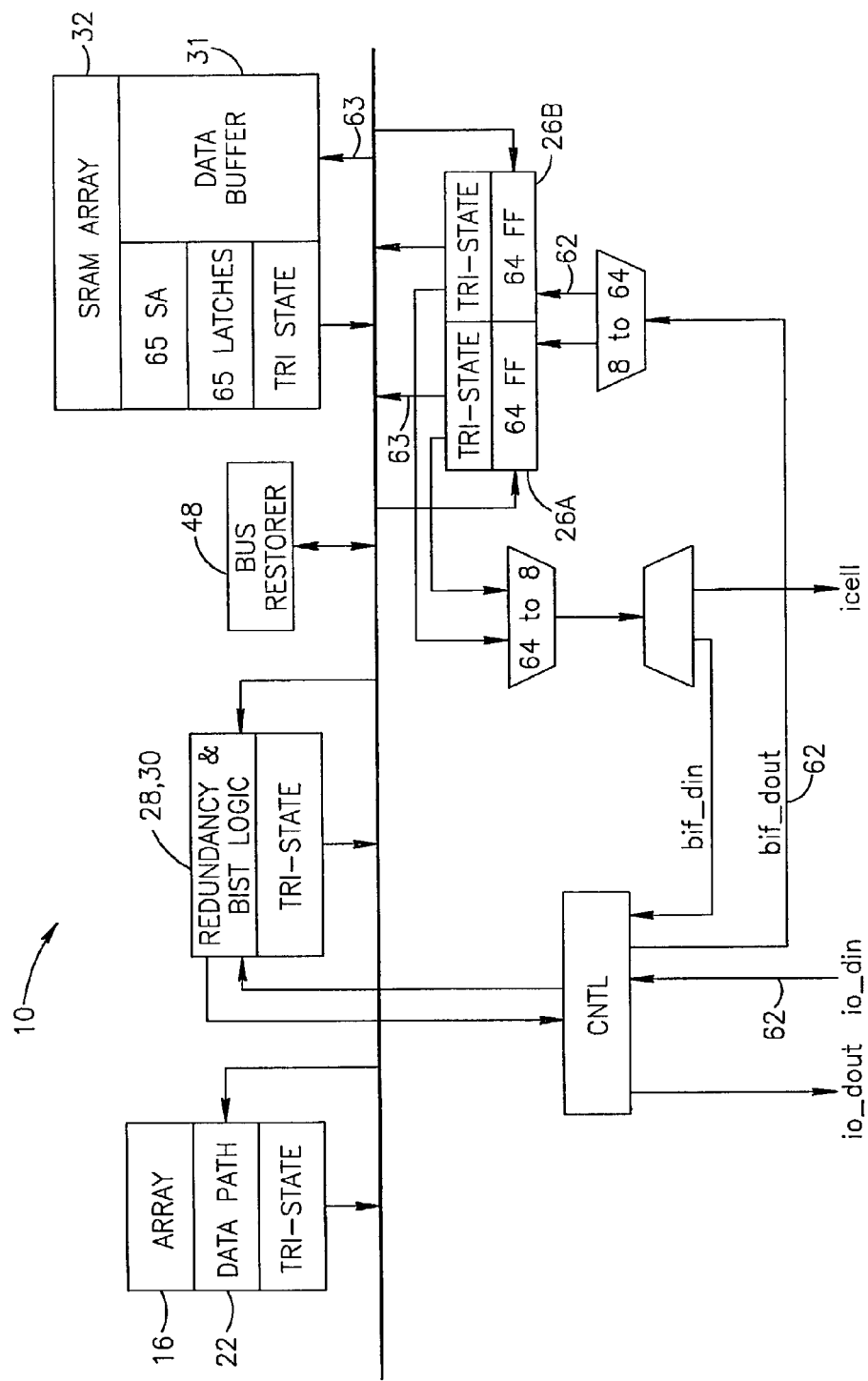

In FIG. 5B, a second internal word may be read (flow of data indicated by arrows 62). Controller may send data "bif_dout", corresponding to the second internal word, to second slave buffer 26B, as indicated by data flow arrows 62. In the meantime, the first internal word may start to be uploaded from first slave buffer 26A of BIF 26 to the data buffer 31 of SRAM 32, as indicated by arrows 63.

Figure 5C:
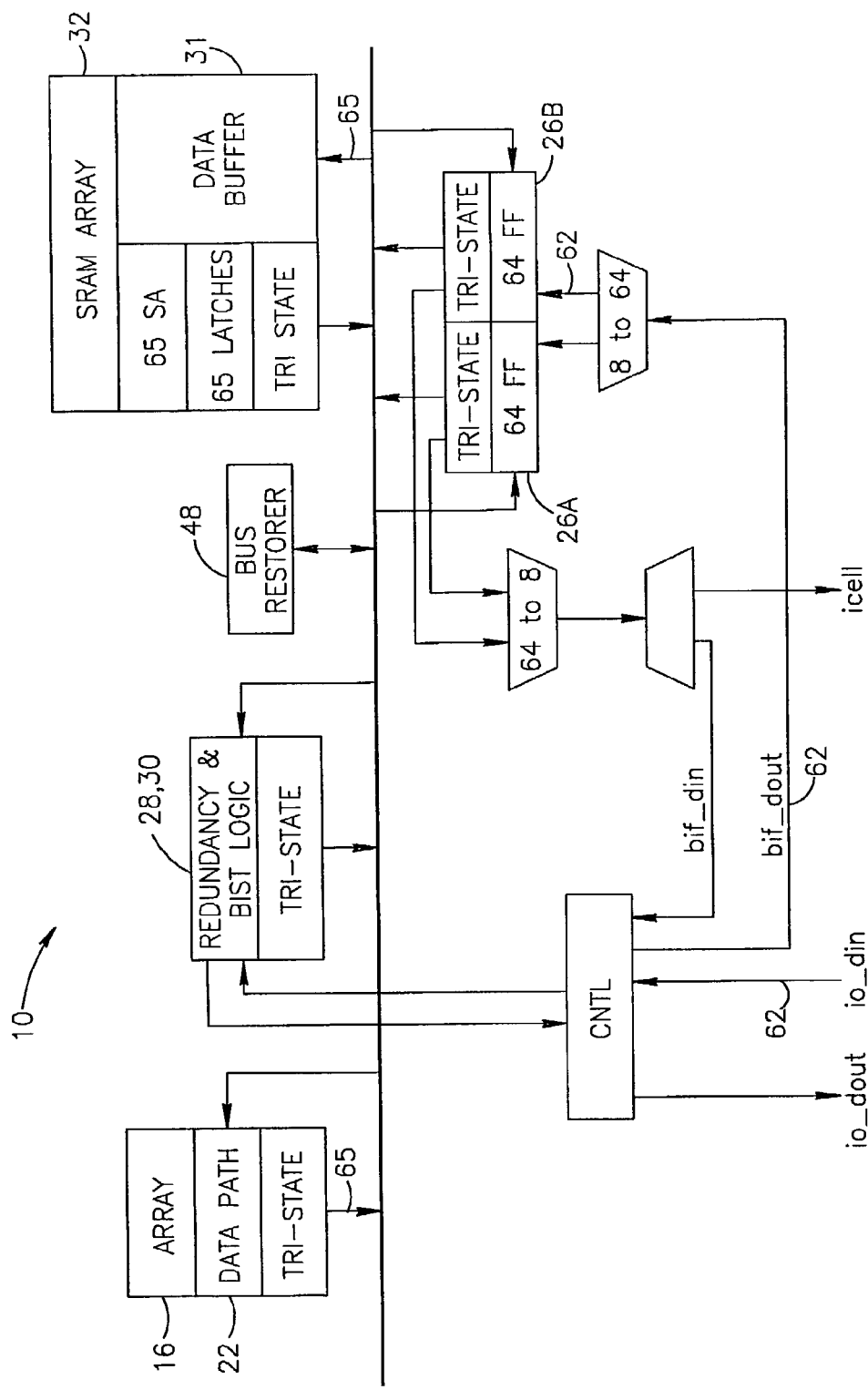

In FIG. 5C, the first internal word has been completely uploaded from first slave buffer 26A to the data buffer 31. The second internal word may still be in the process of being stored in second slave buffer 26B, as indicated by data flow arrows 62. Meanwhile, a read access to array 16 may be performed (corresponding to the address of the already loaded word in data buffer 31), and a complex operation may be performed while still loading the second slave buffer 26B. This is indicated by arrows 65 in FIG. 5C. The read access to array 16 and the complex operation on the data of buffer 31 may be performed to verify which of the bits require programming.

Figure 5D:
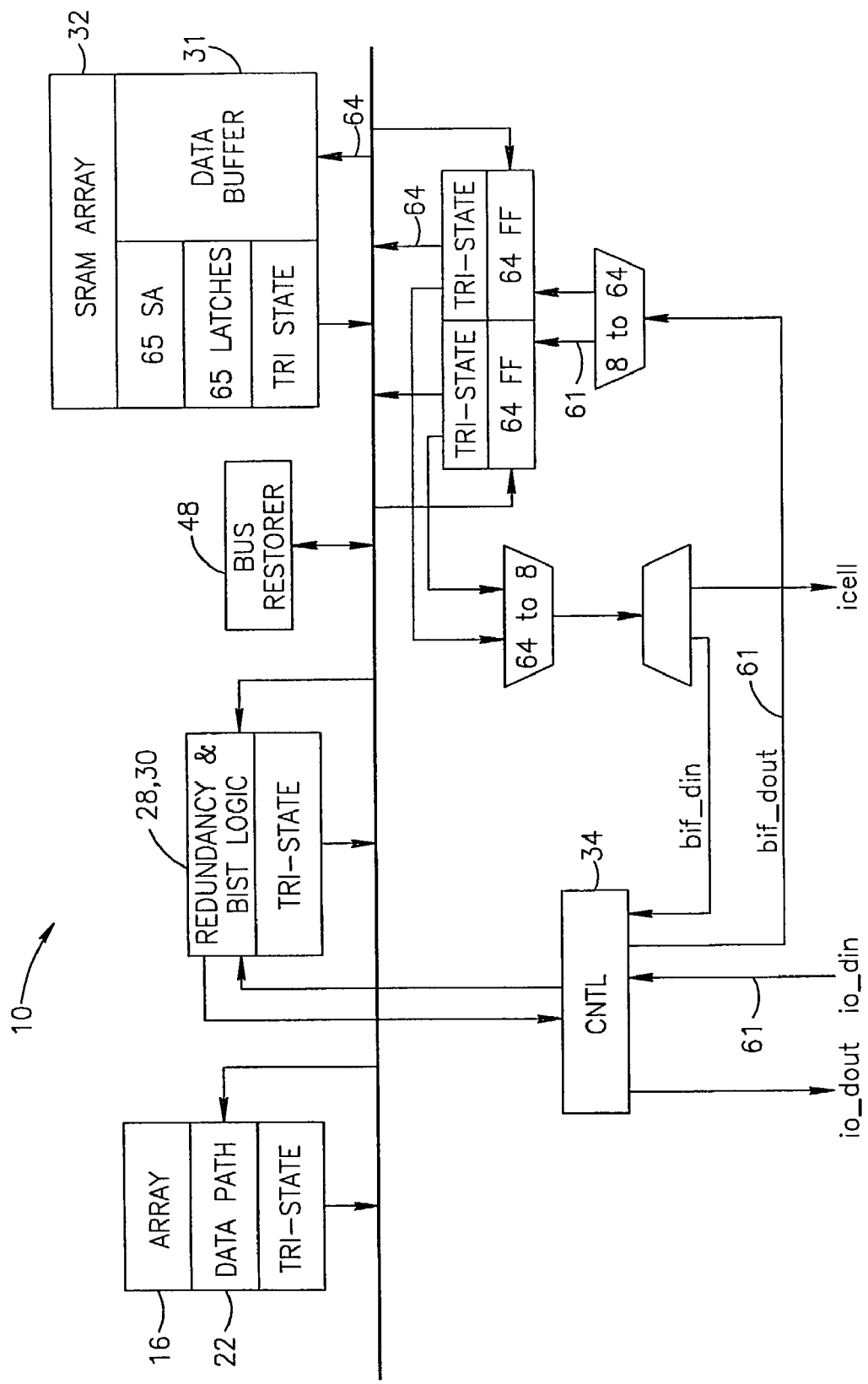

After the second internal word has been fully stored in second slave buffer 26B, data may be uploaded from second slave buffer 26B to the data buffer 31 of SRAM 32, as indicated by arrows 64 in FIG. 5D. Meanwhile, the controller 34 may send data "bif_dout", corresponding to the third internal word, to first slave buffer 26A, as indicated by data flow arrows 61 in FIG. 5D. Then, another read access to array 16 may be done to perform a complex operation on another word of the data buffer 31.

This process may continue until all the data is loaded into the data buffer 31. As this stage ends, the data stored in the data buffer 31 reflects which of the corresponding bits in the array 16 require further programming and which do not.

Using this architecture may save time, because the time required for the pre-program verify operation is embedded in the time required to load the programming data.

In an alternative embodiment of the present invention, the data may be fully loaded into the data buffer 31 without performing the embedded pre-program verify operations. This mode may be used if the corresponding bits in the array are known to be in an erased state.

Figure 6:
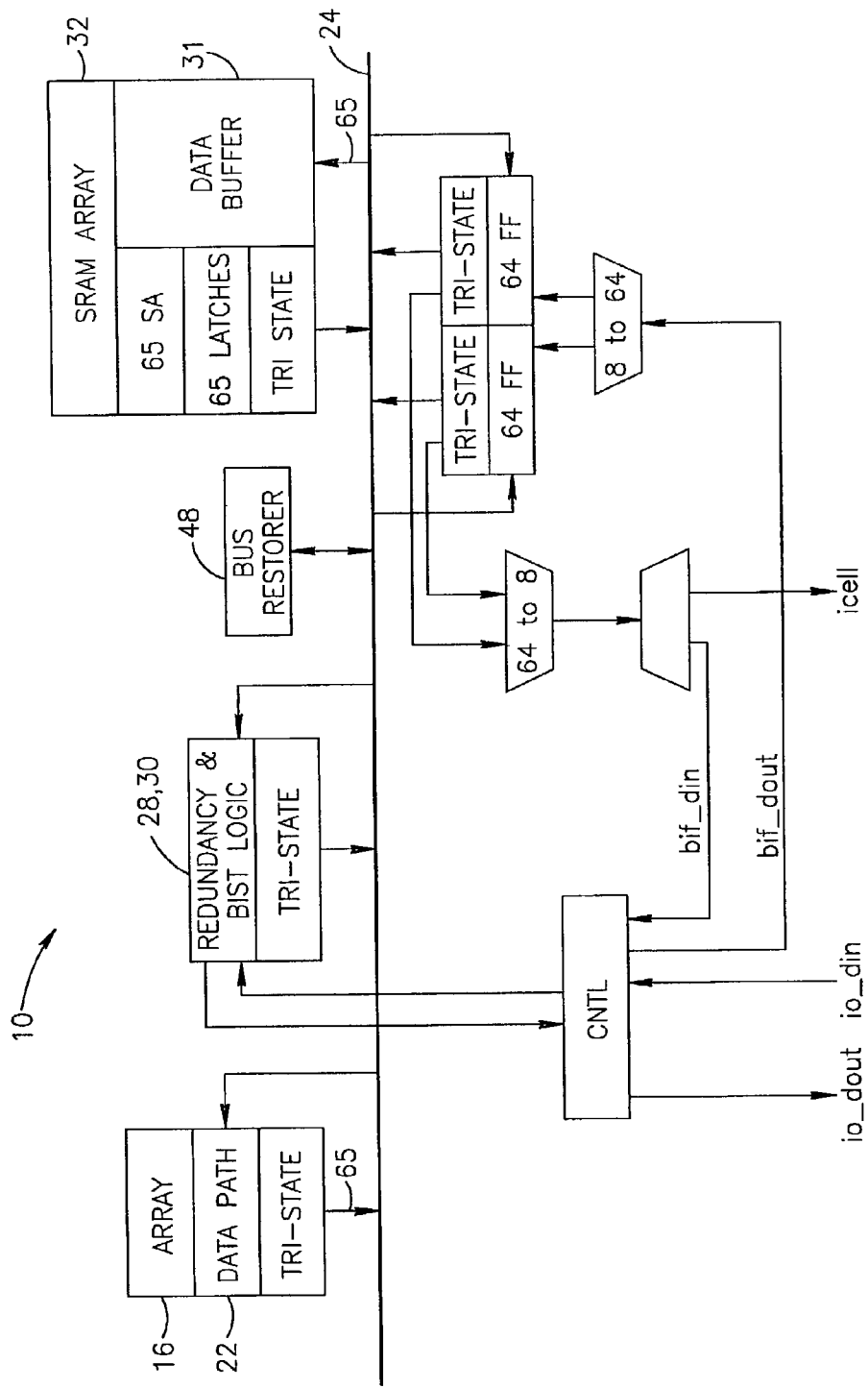
FIG. 6 is a simplified illustration of an example of internal read/verify with the memory device of FIG. 1, in accordance with an embodiment of the present invention.

Reference is now made to FIG. 6, which illustrates an example of internal read verify with the memory device 10, in accordance with an embodiment of the present invention. Internal read verify may be performed after block insertion, during block insertion, or during programming (e.g. after applying programming pulses). In this mode of operation, array 16 and data path 22 may communicate with data buffer 31 of SRAM 32 via main data bus 24, as indicated by arrows 65 in FIG. 6.

Reference is now made to FIGS. 7A–7F, which illustrate an example of programming to array 16 with the memory device 10, in accordance with an embodiment of the present invention. Programming may comprise a first in, first out (FIFO) method with three levels of data transfer: first level, master buffer 22B of data path 22; second level, first slave buffer 26A of BIF 26; and third level, second slave buffer 26A of BIF 26.

Figure 7A:
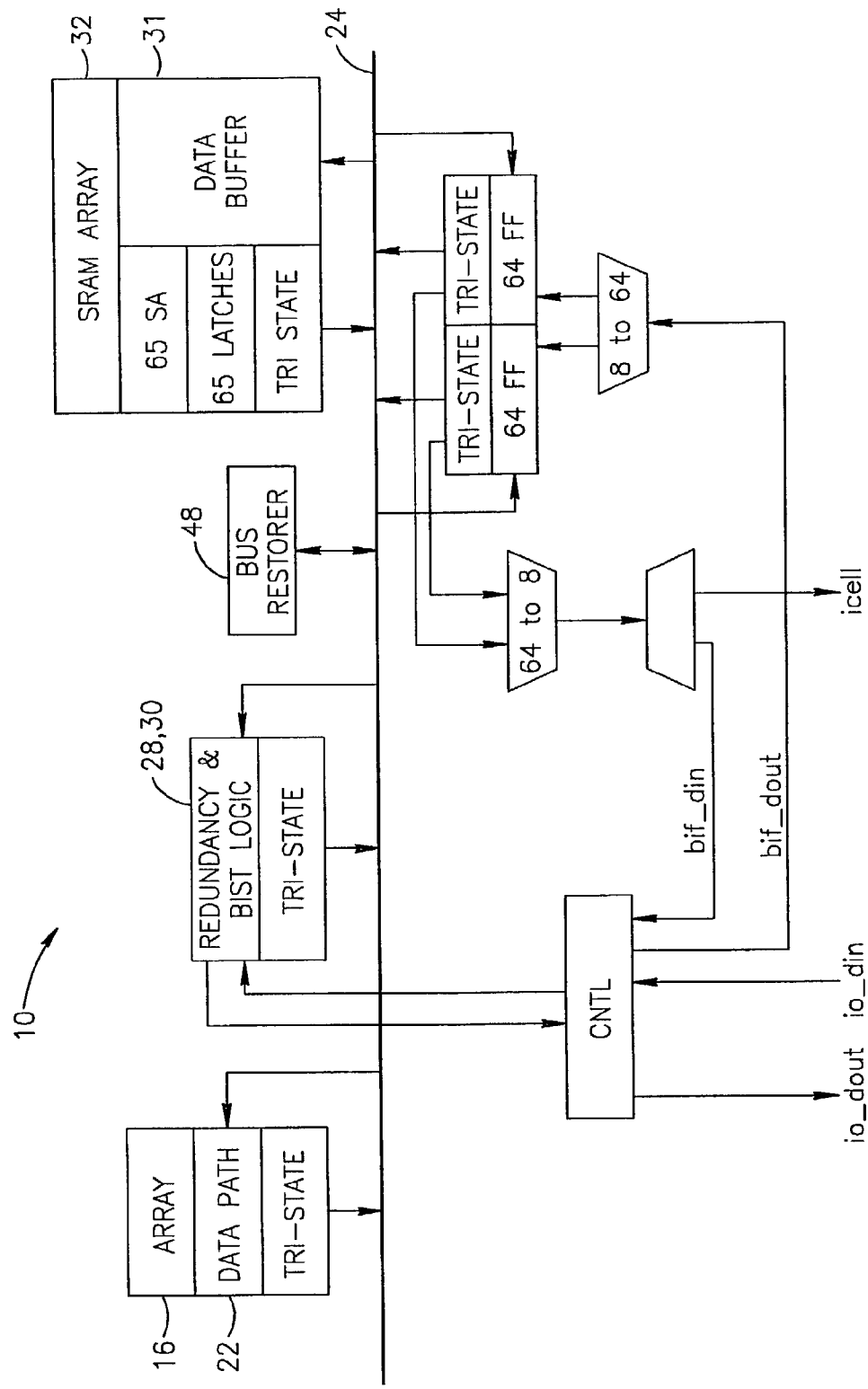
FIGS. 7A–7F are simplified illustrations of an example of programming to the array of FIG. 1, in accordance with an embodiment of the present invention, wherein the programming may comprise a first in, first out (FIFO) method with three levels of data transfer.
Figure 7B:
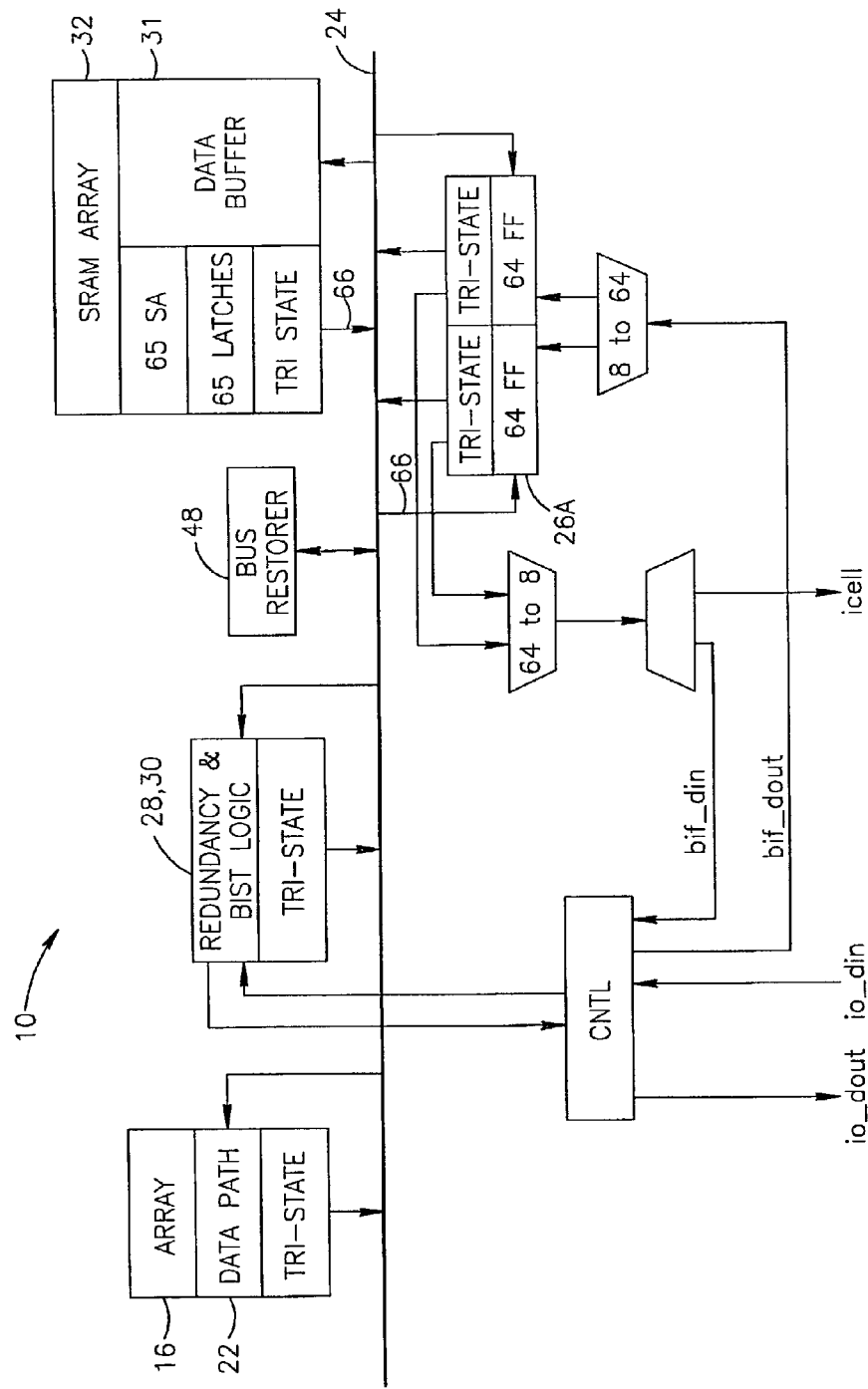
Figure 7C:
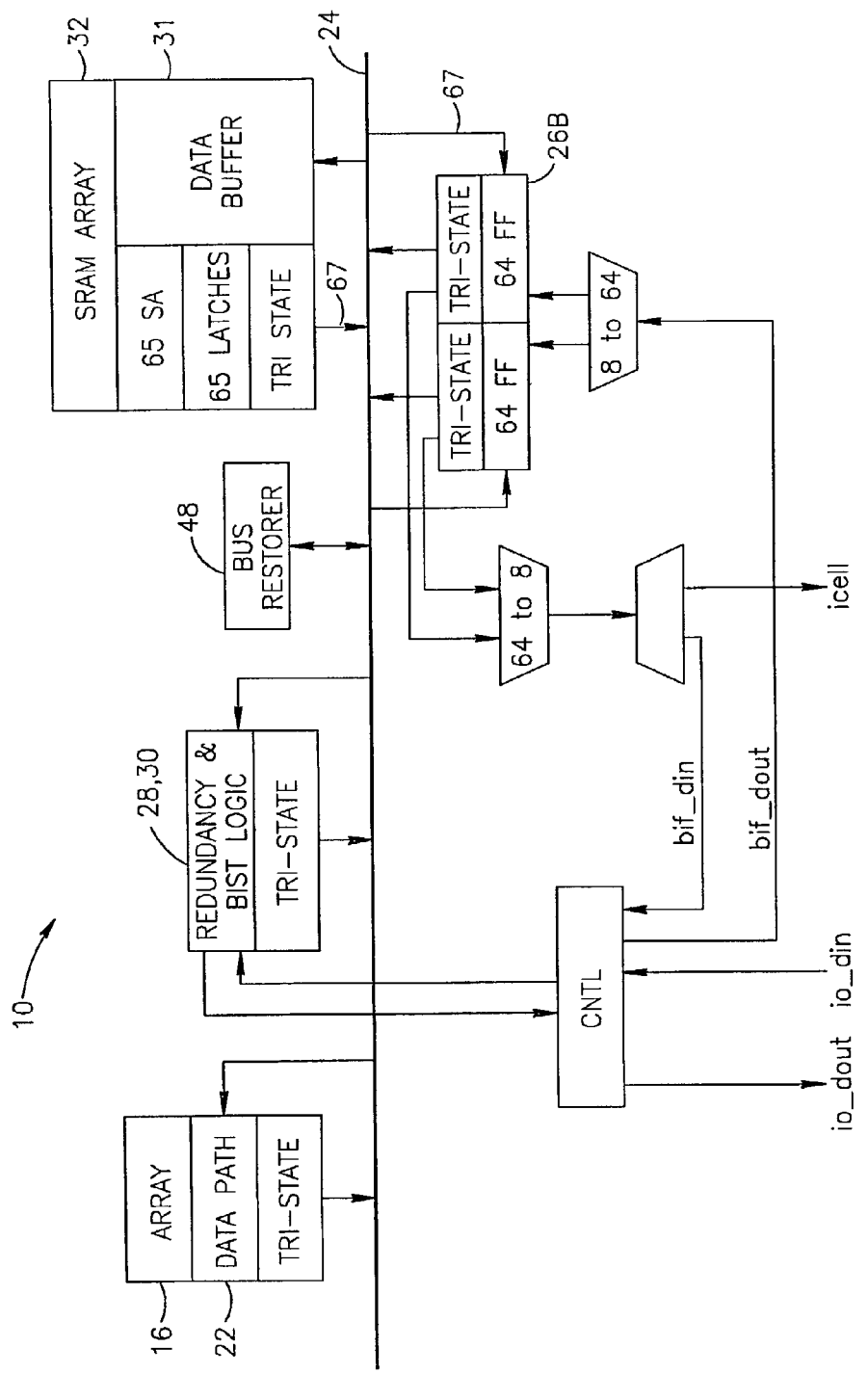

In FIG. 7A, data has been stored in SRAM 32 and is ready for writing to array 16. In FIG. 7B, a first portion of the data may be sent to first slave buffer 26A via main data bus 24, as indicated by arrows 66. In FIG. 7C, the next portion of the data may be sent to second slave buffer 26B via main data bus 24, as indicated by arrows 67. Data is still stored in first slave buffer 26A.

Figure 7D:
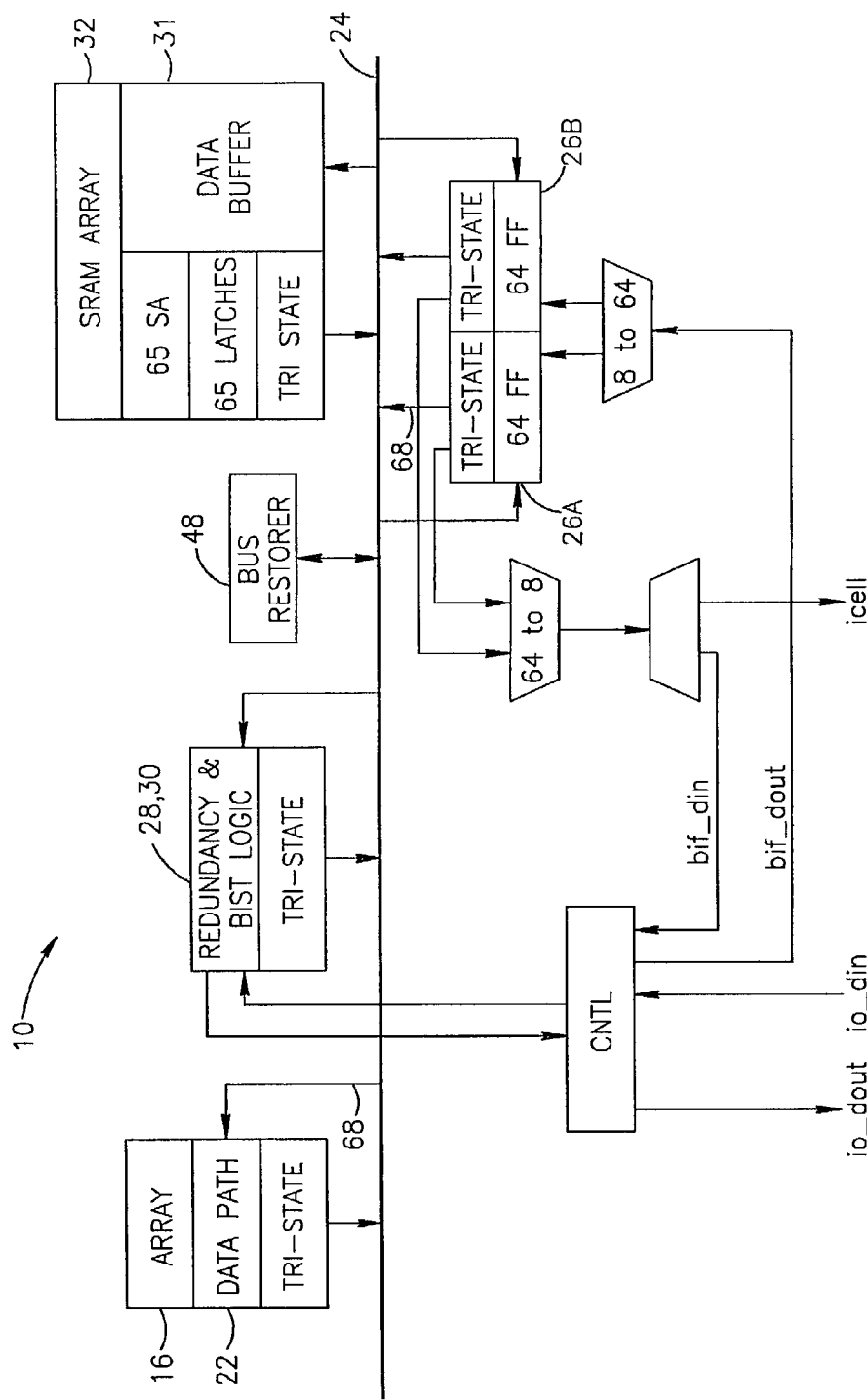
Figure 7E:
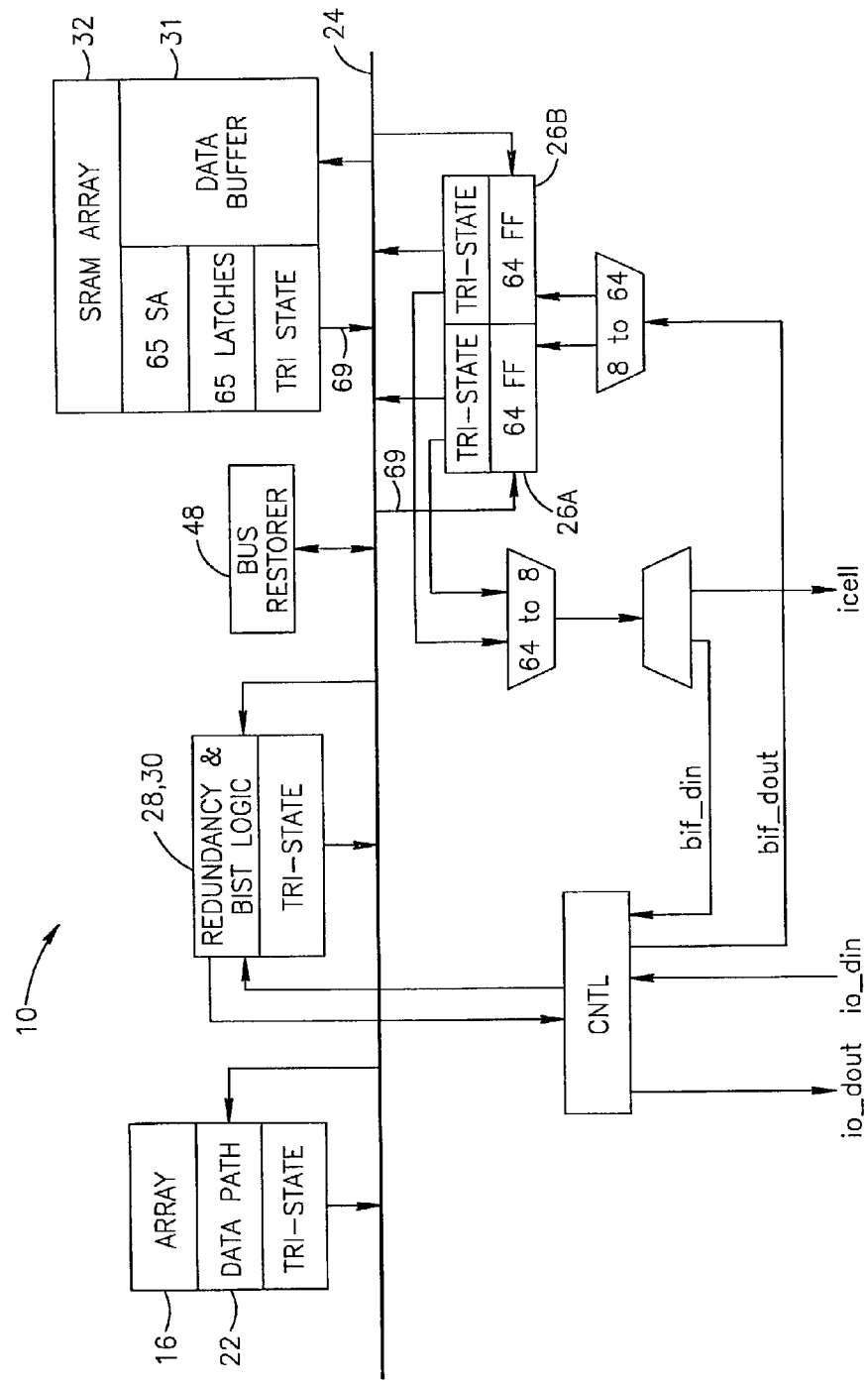
Figure 7F:
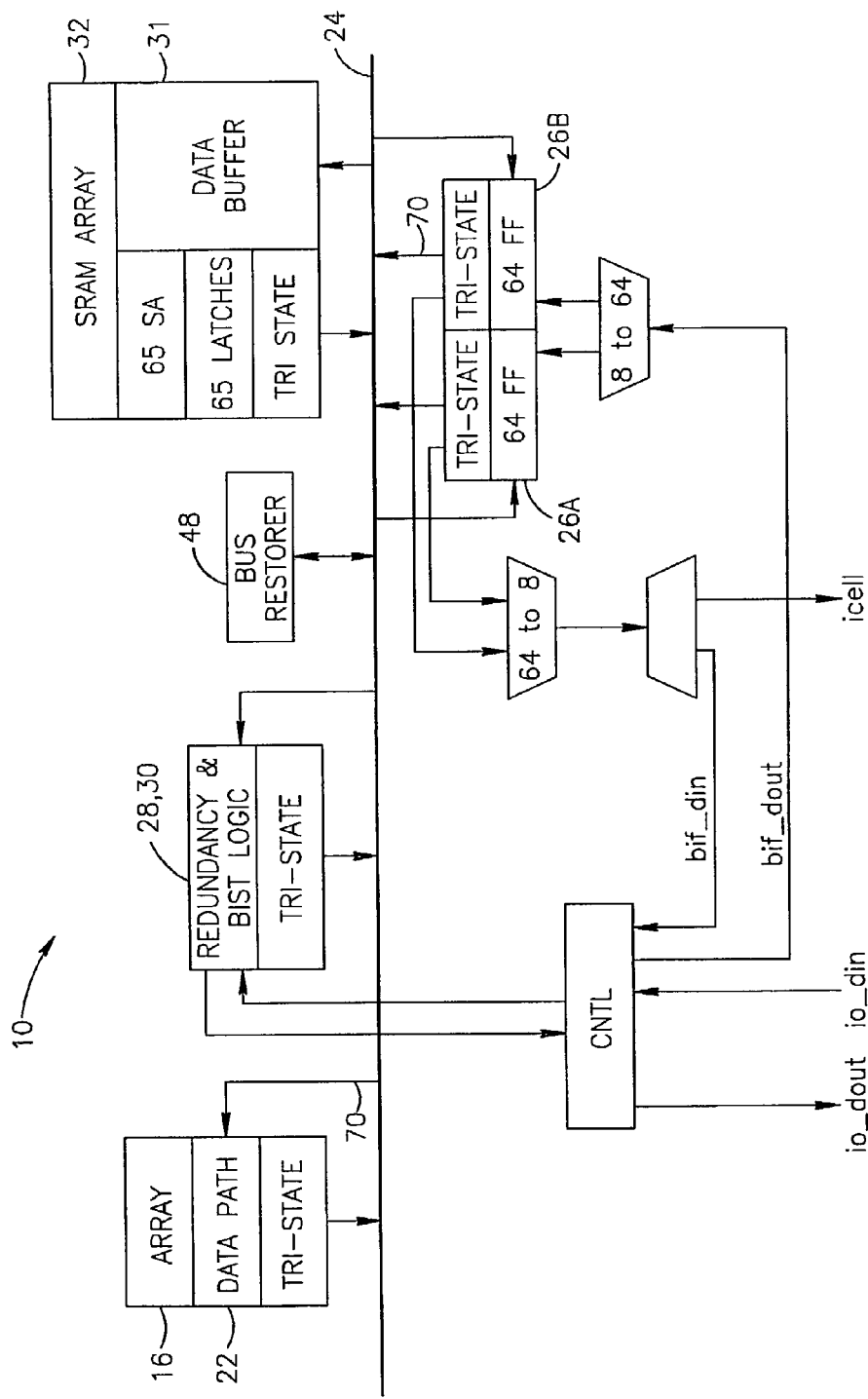

In FIG. 7D, the data stored in first slave buffer 26A may be sent to data path 22 (master buffer 22B of FIG. 3) via main data bus 24, as indicated by arrows 68. Data is still stored in second slave buffer 26B. As seen in FIG. 7E, once all of the data has been sent from first slave buffer 26A to data path 22 a program pulse may be applied to the respective bits in array 16 according to the data stored in data path 22. Meanwhile, a subsequent portion of the data may be sent from SRAM 32 to first slave buffer 26A via main data bus 24, as indicated by arrows 69. Afterwards or simultaneously, as seen in FIG. 7F, the data stored in second slave buffer 26B may be sent to data path 22 (master buffer 22B of FIG. 3) via main data bus 24, as indicated by arrows 70.

This sequence of events may continue until all the bits in array 16, corresponding to the data stored in data buffer 31, and which require further programming, are applied with a programming pulse. An internal read verify operation may typically follow.

This architecture and method of operation does not require accessing all the words in array 16 corresponding to the words in the data buffer 31. Words in data buffer 31 that have no bit at 0 may be bypassed. This may enable employing a look-ahead operation as described in a copending U.S. patent application, the disclosure of which is incorporated herein by reference.

Reference is now made to FIGS. 8A–8E, which illustrates an example of reading from array 16 with the memory device 10 in an enhanced read mode, in accordance with an embodiment of the present invention.

The enhanced read mode may be activated by a command or it may be the standard operation mode. When the mass storage device 10 recognizes the start of the enhanced read operation, the device 10 may go into a BUSY state.

Figure 8A:
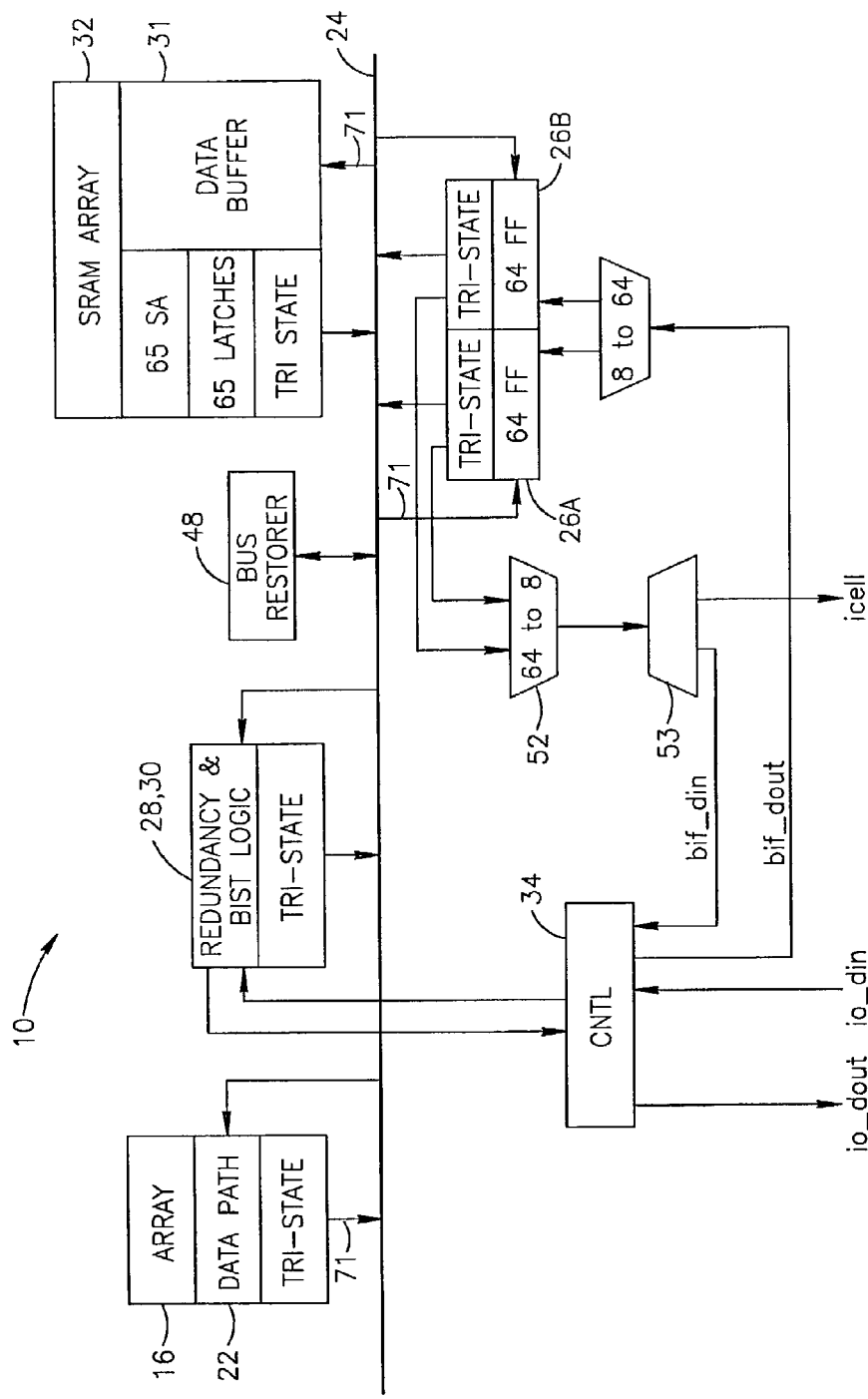
FIGS. 8A–8D are simplified illustrations of an example of an enhanced read mode operation with the array of FIG. 1, in accordance with an embodiment of the present invention.
Figure 8B:
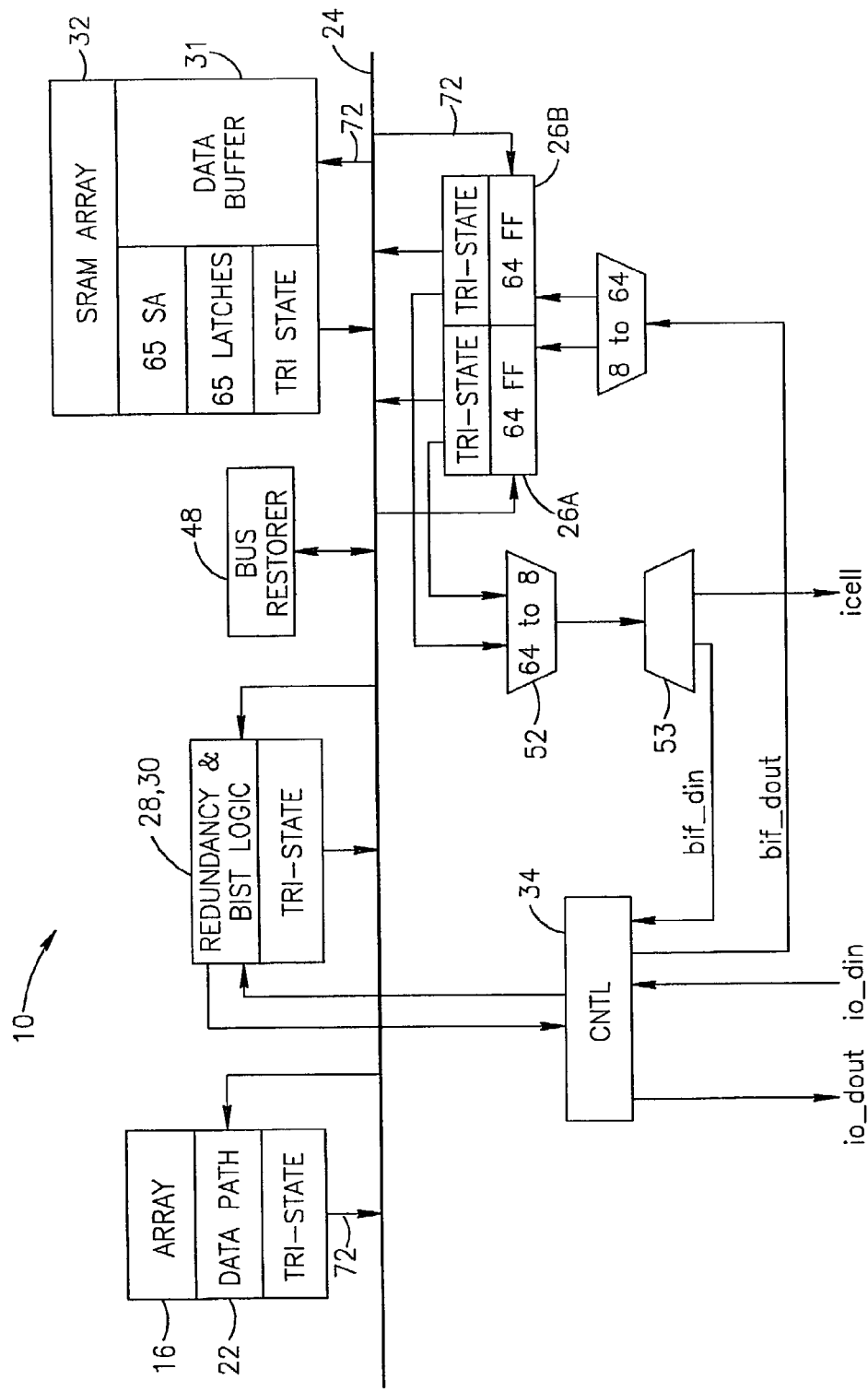

In FIG. 8A, a first portion of the data from array 16 may be sent to first slave buffer 26A via main data bus 24, as indicated by arrows 71. It is noted that data may be stored simultaneously in SRAM 32. In FIG. 8B, the next portion of the data may be sent to second slave buffer 26B via main data bus 24, as indicated by arrows 72. Again, data may also be stored in SRAM 32.

Figure 8C:
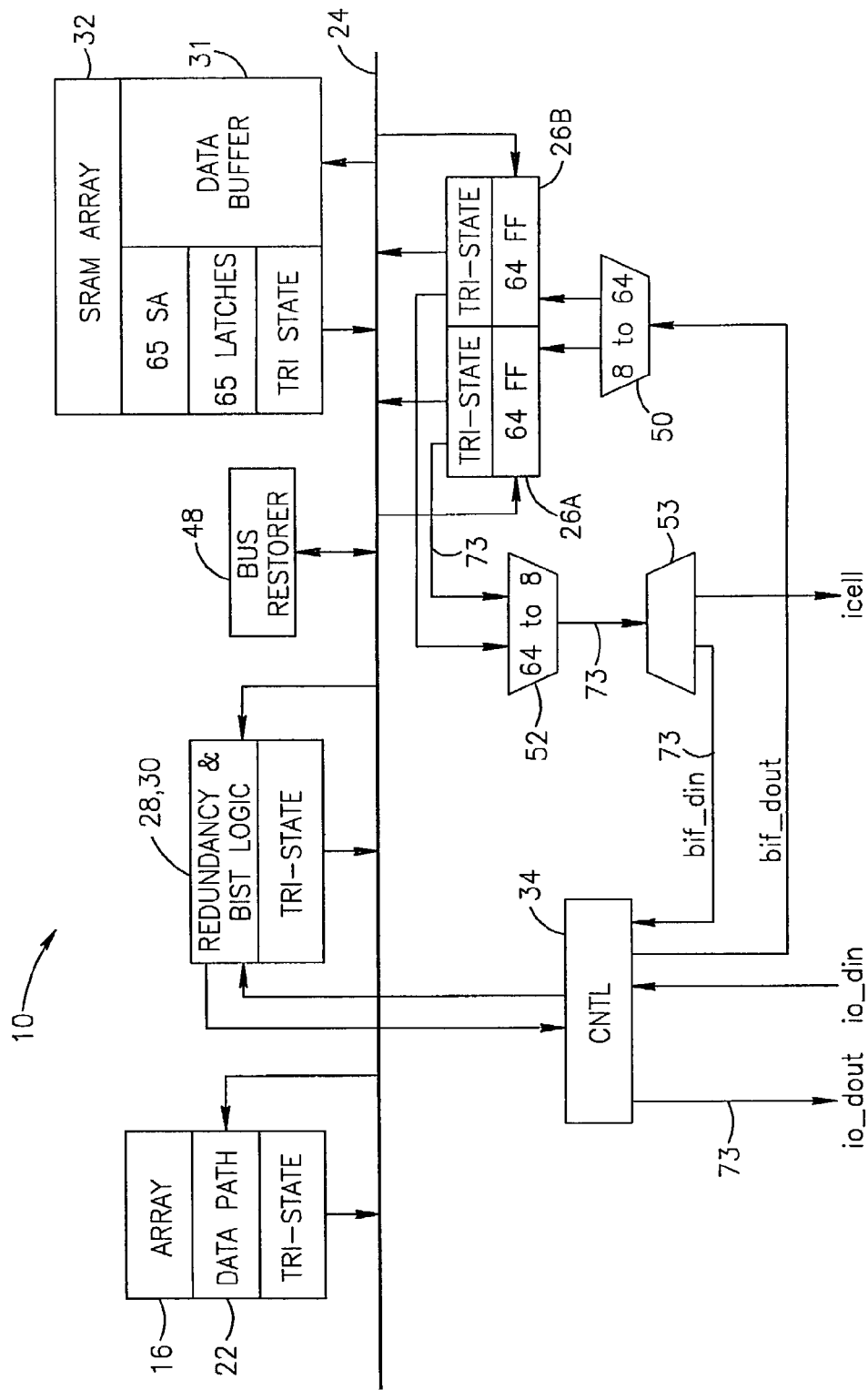

In FIG. 8C, the data that has been stored in first slave buffer 26A may be sent to controller 34 (word "bif_din") via converter 52 and inverter 53, as indicated by arrows 73. Controller 34 may then send data (word "io_dout") to I/O 36 (not shown). Data is still stored in second slave buffer 26B.

At this stage, the status of mass storage device 10 may be designated as READY, and an external user may commence "pulling" the data out of the device, for example by toggling the output enable signal.

The external output enable signal toggling, while sending data loaded in the first slave buffer 26A to I/O unit 36 (not shown), may initiate an additional access to the array. The new data read from the array may wait in the data path 22 buffer until all the data from the first slave buffer 26A has been sent to the I/O unit 36.

Figure 8D:
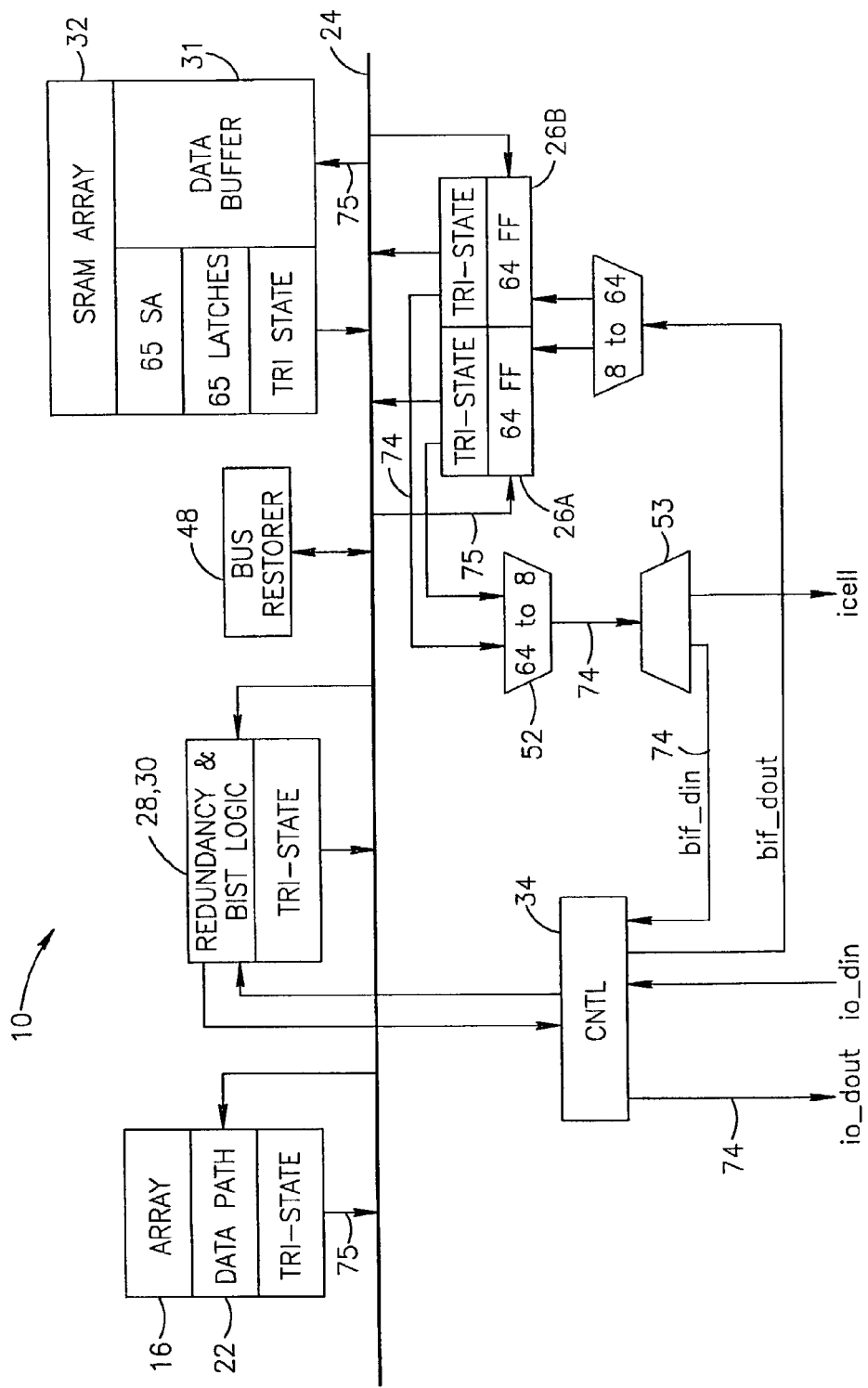

FIG. 8D shows what happens next. In FIG. 8D, the data that has been stored in second slave buffer 26B may be sent to controller 34 (word "bif_din") via converter 52 and inverter 53, as indicated by arrows 74. Controller 34 may then send data (word "io_dout") to I/O 36 (not shown). At the same time, the subsequent portion of the data from array 16 that was waiting in data path 22 may be sent to first slave buffer 26A (and SRAM 32) via main data bus 24, as indicated by arrows 75. As the data from the second slave buffer 26B is being sent to the I/O unit 36 according to the external output enable signal toggling, another access to the array may be performed as previously described.

The process of outputting data from the slave buffers 26A and 26B one at a time, as well as triggering read access to the array 16 by the external-user pull-out data signal, and reloading the emptied slave buffer with the new data read out from the array 16, may continue until the accessed block is fully read out.

This architecture and the enhanced read mode operation may enable the external user to start pulling data as soon as a few words are read from the array 16 (e.g., after reading three 64 bits words). Therefore, a very short first bit latency may be provided, such as less than 5 µsec.

In mass storage NVM devices, external error detection or error correction algorithms may be used. In such cases, if an error is detected, an additional read of the same data (re-read) may be required. Since while loading the slave buffers, as described in FIGS. 8A–8D, the data is simultaneously written into the data buffer 31, the same data may be read out again and again directly from the data buffer without requiring any additional access to the NVM array 16. Therefore, the invention may enable re-read operations of the same data with even shorter first bit latency (e.g., less than 100 ns).

This mass storage device architecture supports also a non-enhanced read mode of operation. In this case, the array 16 may be accessed and read while being controlled by an internal clock, in a continuous mode, until a full section (e.g., a full block) is loaded into the data buffer 31. The mass storage device may only then be ready for an external user to start pulling out the data.

It will be appreciated by persons skilled in the art that the present invention is not limited by what has been particularly shown and described herein above. Rather the scope of the invention is defined by the claims that follow:

What is claimed is:

1. A mass storage device comprising: at least one array of memory cells; at least one data path unit in communication with said at least one array, said at least one data path unit comprising a master buffer; and a main data bus adapted to enable the transfer of data between said at least one data path unit and an input/output (I/O) unit via a buffer interface unit (BIF) comprising a plurality of slave buffers, said main data bus being further adapted to support at least one of a download and upload of data between said main data bus and said I/O unit, during an interleaving performance of an internal operation between said main data bus and said at least one array, said internal operation comprising at least one of a read, program and erase operation.

2. The device according to claim 1, further comprising a volatile memory device comprising a data buffer and a redundancy buffer in communication with said main data bus.

3. The device according to claim 2, wherein said volatile memory device comprises a static random access memory device (SRAM).

4. The device according to claim 2, wherein said data buffer and said redundancy buffer have the same size.

5. The device according to claim 2, wherein said data buffer and said redundancy buffer have different sizes.

6. The device according to claim 2, wherein said data buffer and said redundancy buffer are interleaved, utilizing mutual peripheral circuits.

7. The device according to claim 1, wherein said at least one array comprises a redundant unit dedicated to store data that is supposed to be stored in other portions of said at least one array, and said redundancy unit is adapted to re-route data which is intended for one portion of said at least one array to said redundant portion.

8. The device according to claim 7, wherein said redundancy unit re-routes the data based on volatile data stored in a redundancy buffer.

9. The device according to claim 8, wherein said volatile data stored in the redundancy buffer is loaded from a non-volatile memory when the device is powered up.

10. The device according to claim 9, wherein said redundancy unit re-route the data once before accessing a block of data.

11. The device according to claim 1, wherein said master buffer has the same size as an internal word of said at least one array.

12. The device according to claim 1, wherein said slave buffers have the same size as an internal word of said at least one array.

13. A method for operation of a mass storage device, the method comprising: providing at least one array of memory cells, at least one data path unit in communication with said at least one array, said at least one data path unit comprising a master buffer, and a main data bus adapted to enable the transfer of data between said at least one data path unit and an input/output (I/O) unit via a buffer interface unit (BIF) comprising a plurality of slave buffers; and performing at least one of a download and upload of data between said main data bus and said I/O unit, while interleavingly performing an internal operation between said main data bus and said at least one array, said internal operation comprising at least one of a read, program and erase operation.

14. The method according to claim 13 wherein performing said internal operation comprises: inserting data from said I/O unit to a first of said slave buffers; and inserting data from said I/O unit to a second of said slave buffers, while uploading data from said first slave buffer to a data buffer of a volatile memory device.

15. The method according to claim 14 wherein performing said internal operation further comprises performing a read access to said at least one array while still inserting data from said I/O unit to one of said slave buffers.

16. The method according to claim 14 wherein performing said internal operation further comprises re-reading data directly from said volatile memory device without re-reading said data from said at least one array.

17. The method according to claim 14, wherein performing said internal operation further comprises performing a Boolean operation on binary integers 0 and 1 that designate a programmed state of a bit in said at least one array (referred to as "ARRAY") and whether said volatile memory device includes programming instructions for said bit (referred to as "SRAM"), wherein binary integer 0 indicates that said bit is required to be programmed, and binary integer 1 indicates that said bit is not required to be programmed.

18. The method according to claim 17, further comprising performing said Boolean operation within a single clock cycle.

19. The method according to claim 17, wherein performing said internal operation comprises verifying which bits in said at least one array need to be programmed by performing a "complex mode" function comprising the Boolean operation ("SRAM") OR (NOT "ARRAY").

20. The method according to claim 17, wherein performing said internal operation comprises determining which bits in said at least one array need to be re-programmed, in an operation to recover original data to be programmed in said at least one array, by performing an "n-complex mode" function comprising the Boolean operation ("SRAM") AND ("ARRAY").

21. The method according to claim 14 wherein performing said internal operation further comprises programming data in said at least one array by means of a first in, first out (FIFO) method comprising a first level of data transfer to and from said master buffer, a second level of data transfer to and from said first slave buffer, and a third level of data transfer to and from said second slave buffer.

22. The method according to claim 21 wherein said programming comprises: transferring a first portion of data from said volatile memory device to said first slave buffer; transferring a second portion of data from said volatile memory device to said second slave buffer; transferring said first portion of data stored in said first slave to said master buffer while said second portion of data is still stored in said second slave buffer; and applying a program pulse to bits in said at least one array in accordance with said first portion of data.

23. The method according to claim 22 wherein said programming comprises: transferring another first portion of data from said volatile memory device to said first slave buffer; and transferring said second portion of data stored in said second slave to said master buffer.

24. The method according to claim 14 wherein performing said internal operation comprises performing an enhanced read operation comprising: transferring a first portion of data from said at least one array to said first slave buffer; transferring a second portion of data from said at least one array to said second slave buffer; transferring said first portion of data from said first slave buffer to said I/O unit; and extracting data from said I/O unit.

25. The method according to claim 24 wherein extracting data from said I/O unit initiates an additional read access to said at least one array, wherein data is transferred from said at least one array to said at least one of said main buffer, said first slave buffer and said second slave buffer.

26. The method according to claim 24, further comprising transferring said second portion of data from said second slave buffer to said I/O unit, and extracting data from said I/O unit.

27. The method according to claim 26 wherein extracting data from said I/O unit initiates an additional read access to said at least one array, wherein data is transferred from said at least one array to said at least one of said main buffer, said first slave buffer and said second slave buffer.

28. The method according to claim 24, further comprising repeatedly extracting data from said I/O unit so as to repeatedly output data from said slave buffers one at a time, repeatedly trigger a new read access from said at least one array, and repeatedly reload the slave buffer that is empty with data from said master buffer until the data to be read is fully read out.

* * * * *

UNITED STATES PATENT AND TRADEMARK OFFICE
CERTIFICATE OF CORRECTION

| | |
|---|---|
| PATENT NO. | : 7,062,619 B2 |
| APPLICATION NO. | : 10/211235 |
| DATED | : June 13, 2006 |
| INVENTOR(S) | : Ran Dvir et al. |

It is certified that error appears in the above-identified patent and that said Letters Patent is hereby corrected as shown below:

Title Page, Item
[73] Assignee. The first Assignee should appear as --SAIFUN SEMICONDUCTORS LTD.-- The second assignee was omitted and should read: --INFINEON TECHNOLOGIES FLASH LTD.--

Signed and Sealed this

Twenty-fourth Day of April, 2007

JON W. DUDAS
*Director of the United States Patent and Trademark Office*